US010559464B2

(12) United States Patent
Kuwabara et al.

(10) Patent No.: US 10,559,464 B2
(45) Date of Patent: Feb. 11, 2020

(54) METHOD FOR MANUFACTURING PHOTOELECTRIC CONVERSION DEVICE

(71) Applicant: CANON KABUSHIKI KAISHA, Tokyo (JP)

(72) Inventors: Hideshi Kuwabara, Yamato (JP); Nobutaka Ukigaya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/584,748

(22) Filed: May 2, 2017

(65) Prior Publication Data

US 2017/0323787 A1 Nov. 9, 2017

(30) Foreign Application Priority Data

May 9, 2016 (JP) ................. 2016-094171

(51) Int. Cl.
| | | |
|---|---|---|
| H01L 21/02 | (2006.01) | |
| H01L 31/18 | (2006.01) | |
| H01L 31/0264 | (2006.01) | |
| H01L 31/04 | (2014.01) | |
| H01L 31/20 | (2006.01) | |

(52) U.S. Cl.
CPC .. *H01L 21/02365* (2013.01); *H01L 21/02491* (2013.01); *H01L 31/0264* (2013.01); *H01L 31/04* (2013.01); *H01L 31/18* (2013.01); *H01L 31/20* (2013.01)

(58) Field of Classification Search
CPC ......... H01L 27/14665; H01L 27/14636; H01L 27/14634; H01L 27/14632; H01L 27/14687; H01L 27/14683–1469; H01L 33/0079; H01L 24/94
See application file for complete search history.

(56) References Cited

U.S. PATENT DOCUMENTS

| | | | |
|---|---|---|---|
| 9,230,941 B2* | 1/2016 | Chen ................. | H01L 27/14634 |
| 9,508,772 B2* | 11/2016 | Takahashi ......... | H01L 21/76898 |
| 9,525,001 B2* | 12/2016 | Cheng .............. | H01L 27/14634 |
| 9,620,548 B1* | 4/2017 | Wang ............... | H01L 27/14636 |
| 2005/0139828 A1 | 6/2005 | Maruyama et al. | |
| 2009/0057890 A1* | 3/2009 | Maebashi .......... | H01L 21/6835 257/737 |

(Continued)

FOREIGN PATENT DOCUMENTS

| | | |
|---|---|---|
| CN | 102714212 A | 10/2012 |
| CN | 103545275 A | 1/2014 |

(Continued)

*Primary Examiner* — Bac H Au
(74) *Attorney, Agent, or Firm* — Canon U.S.A. Inc., IP Division

(57) ABSTRACT

A method for manufacturing a photoelectric conversion device comprising the steps of fixing a first substrate including a semiconductor layer provided with a photoelectric conversion element, to a second substrate, thinning the first substrate fixed to the second substrate, from the opposite side of the first substrate from the second substrate, fixing the first substrate to a third substrate provided with a semiconductor element such that the third substrate is located on the opposite side of the first substrate from the second substrate, and removing the second substrate after the step of fixing the first substrate to the third substrate.

17 Claims, 34 Drawing Sheets

(56) References Cited

U.S. PATENT DOCUMENTS

| | | | |
|---|---|---|---|
| 2009/0149023 A1* | 6/2009 | Koyanagi | H01L 21/76898 438/666 |
| 2011/0042807 A1* | 2/2011 | Liu | H01L 21/76898 257/737 |
| 2012/0267690 A1 | 10/2012 | Endo et al. | |
| 2013/0264688 A1* | 10/2013 | Qian | H01L 21/76898 257/622 |
| 2016/0027833 A1* | 1/2016 | Yamamoto | H01L 27/14683 257/459 |
| 2016/0284753 A1* | 9/2016 | Komai | H01L 27/14634 |
| 2016/0351604 A1* | 12/2016 | Kalnitsky | H01L 27/1463 |

FOREIGN PATENT DOCUMENTS

| | | |
|---|---|---|
| CN | 103579377 A | 2/2014 |
| JP | 4691939 B2 | 6/2011 |
| JP | 2011-138841 A | 7/2011 |
| JP | 4816602 B2 | 11/2011 |
| JP | 4816603 B2 | 11/2011 |
| JP | 4858367 B2 | 1/2012 |
| JP | 5218502 B2 | 6/2013 |

* cited by examiner

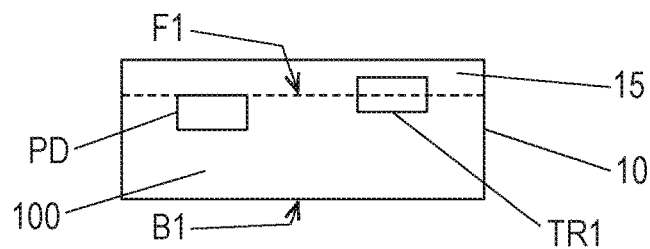

METHOD FOR MANUFACTURING PHOTOELECTRIC CONVERSION DEVICE

BACKGROUND

Field of Art

The present technology relates to a photoelectric conversion device.

Description of the Related Art

There is proposed a photoelectric conversion device in which a light receiving substrate provided with a photoelectric conversion element and a circuit substrate provided with a semiconductor element are stacked. It is expected that stacking a plurality of substrates will improve the performance of the photoelectric conversion device.

Japanese Patent Laid-Open No. 2011-138841 discloses a back side illumination solid-state imaging device in which a first substrate having a photoelectric conversion element and a second substrate having a peripheral circuit portion are stacked.

Stacking a plurality of substrates increases the thickness of the photoelectric conversion device, and therefore substrates are required to be thinned. In Japanese Patent Laid-Open No. 2011-138841, the thinning of a photodiode forming member is performed, and a surface newly formed by thinning serves as a light receiving surface, and therefore noise due to thinning is prone to be generated. Therefore, the improvement in performance of the photoelectric conversion device is not sufficient.

SUMMARY

The present disclosure describes an improvement in the performance of the photoelectric conversion device.

An aspect of an embodiment is a method for manufacturing a photoelectric conversion device comprising the steps of fixing a first substrate including a semiconductor layer provided with a photoelectric conversion element, to a second substrate, thinning the first substrate fixed to the second substrate, from the opposite side of the first substrate from the second substrate, fixing the first substrate to a third substrate provided with a semiconductor element such that the third substrate is located on the opposite side of the first substrate from the second substrate, and removing the second substrate after the step of fixing the first substrate to the third substrate.

Further features will become apparent from the following description of exemplary embodiments with reference to the attached drawings.

BRIEF DESCRIPTION OF THE DRAWINGS

FIGS. 1A to 1F are schematic views illustrating a method for manufacturing a photoelectric conversion device.

DESCRIPTION OF THE EMBODIMENTS

Figure 2A:
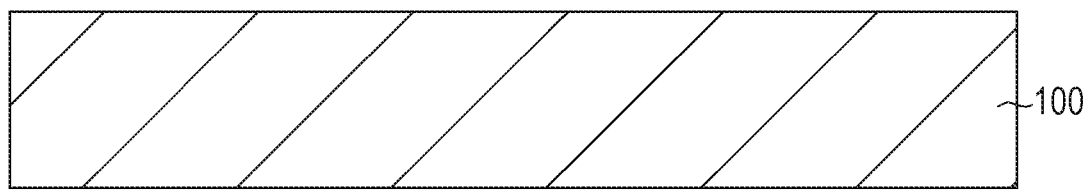
FIGS. 2A to 2E are schematic views illustrating Exemplary embodiment 1 of the method for manufacturing a photoelectric conversion device.

Embodiments will now be described with reference to the drawings. In the following description and figures, the same reference signs are assigned to components common to a plurality of figures. The common components may be described with cross-reference to a plurality of figures. The description of components to which the same reference signs are assigned may be omitted.

FIGS. 1A to 1F are schematic sectional views of a photoelectric conversion device showing sequential steps of a method for manufacturing a photoelectric conversion device.

In step A shown in FIG. 1A, a light receiving substrate 10 provided with a photoelectric conversion element PD is prepared. The light receiving substrate 10 may be provided with a semiconductor element TR1 besides the photoelectric conversion element PD. The light receiving substrate 10 has a semiconductor layer 100 that includes at least part of the photoelectric conversion element PD and at least part of the semiconductor element TR1. In step A, the semiconductor layer 100 has a front surface F1 and a back surface B1. The front surface F1 of the light receiving substrate 10 serves as a light receiving surface of the semiconductor layer 100 of the final photoelectric conversion device. Although the back surface of the light receiving substrate 10 can correspond to the back surface of the semiconductor layer 100, the back surface of the light receiving substrate 10 may be formed by a layer other than the semiconductor layer 100. The semiconductor element TR1 is, for example, an n-type MOS transistor. The semiconductor element TR1 can form a pixel circuit together with the photoelectric conversion element PD. The light receiving substrate 10 can include a first wiring member 15 provided on the semiconductor layer 100. The first wiring member 15 can include at least one of a plurality of components of a wiring structure (multilayer wiring structure) generally used in a semiconductor device. The plurality of components of the wiring structure (multi-layer wiring structure) are a contact plug, a wiring layer, a via plug, an etch stop layer for the contact plug or for the wiring layer, an interlayer insulating layer, a diffusion prevention layer for the wiring layer, and a passivation layer. The light receiving substrate 10 may not include the first wiring member 15.

In step B shown in FIG. 1B, the light receiving substrate 10 provided with the photoelectric conversion element PD is fixed to a supporting substrate 20. In step B, when the light receiving substrate 10 includes the first wiring member 15, the first wiring member 15 is located between the semiconductor layer 100 and the supporting substrate 20.

In step C shown in FIG. 1C, the light receiving substrate 10 fixed to the supporting substrate 20 is thinned from the opposite side of the light receiving substrate 10 from the supporting substrate 20 (the back surface B1 side). The thinning of the semiconductor layer 100 means reducing the thickness of the semiconductor layer 100. In thinning, a part of the light receiving substrate 10 that includes the surface on the opposite side of the light receiving substrate 10 from the supporting substrate 20 (the back surface B1) is removed. By the thinning of the semiconductor layer 100 in step C, a new back surface B2 is formed on the semiconductor layer 100.

In step D shown in FIG. 1D, the thinned light receiving substrate 10 is fixed to a circuit substrate 30 provided with a semiconductor element TR2. This fixation is performed such that the circuit substrate 30 is located on the opposite side of the light receiving substrate 10 from the supporting substrate 20 (the back surface B2 side). The circuit substrate 30 may be provided with a semiconductor element TR3 besides the semiconductor element TR2. The circuit substrate 30 has a semiconductor layer 300 that includes at least part of the semiconductor element TR2 and at least part of the semiconductor element TR3. The semiconductor element TR2 is, for example, an n-type MOS transistor, and the semiconductor element TR3 is, for example, a p-type MOS transistor. The semiconductor element TR2 and the semiconductor element TR3 can together form an analog signal processing circuit, a digital signal processing circuit, an AD conversion circuit, or a drive circuit. The circuit substrate 30 may be provided with a photoelectric conversion element. The photoelectric conversion element PD provided in the circuit substrate 30 can receive light transmitted through the light receiving substrate 10.

The circuit substrate 30 can include a second wiring member 35 provided on the semiconductor layer 300. As with the first wiring member 15, the second wiring member 35 can include at least one of a plurality of components of a wiring structure (multilayer wiring structure) generally used in a semiconductor device. The circuit substrate 30 may not include the second wiring member 35. As shown in FIG. 1D, in step D, when the circuit substrate 30 includes the second wiring member 35, the second wiring member 35 can be located between the semiconductor layer 300 and the light receiving substrate 10. Alternatively, the circuit substrate 30 can also be disposed such that the semiconductor layer 300 is located between the second wiring member 35 and the light receiving substrate 10.

In step E shown in FIG. 1E, the supporting substrate 20 is removed from the light receiving substrate 10 fixed to the circuit substrate 30. Although the supporting substrate 20 is preferably completely removed, at least part of the supporting substrate 20 may be removed, and part of the supporting substrate 20 may remain on the light receiving substrate 10 without affecting reception of light.

In step F shown in FIG. 1F, after the step E of removing the supporting substrate 20, an optical member 40 is formed on the opposite side of the light receiving substrate 10 from the circuit substrate 30 (the front surface F1 side). The optical member 40 can include at least one of a light condensing portion such as a top lens (microlens) or an interlayer lens, a wavelength selecting portion such as a color filter, a light guiding portion having a core-clad structure (also referred to as light guiding path or light waveguide), and a light shielding portion.

When, in step B, the light receiving substrate 10 does not include the first wiring member 15, a wiring member corresponding to the first wiring member 15 may be formed between step E and step F. Part of the first wiring member 15 may be formed in step A, and the rest of the first wiring member 15 may be formed between step E and step F.

After that, the stacked body of the light receiving substrate 10 and the circuit substrate 30 is diced, and chips in which a plurality of substrates are stacked can be obtained. The chips are packaged.

In this embodiment, since the light receiving substrate 10 is thinned, an increase in thickness of the photoelectric conversion device can be suppressed when the circuit substrate 30 is provided.

In this embodiment, since the light receiving substrate 10 is thinned from the surface on the opposite side from the supporting substrate 20, and the supporting substrate 20 side surface can be used as a light receiving surface, noise that can be generated due to thinning can be reduced.

In this embodiment, since the supporting substrate 20 is removed, attenuation of light incident on the semiconductor layer 100 caused by the supporting substrate 20 can be suppressed.

In this embodiment, since the optical member 40 is formed after the removal of the supporting substrate 20, the optical member 40 can be prevented from being damaged during the attachment and detachment of the supporting substrate 20 (steps B and E) and during the thinning of the light receiving substrate 10 (step C). Therefore, a photoelectric conversion device having excellent optical properties can be obtained. Similarly, if at least part of the first wiring member 15 is formed after the removal of the supporting substrate 20, the damage of the first wiring member 15 can be reduced. Therefore, a photoelectric conversion device having excellent electrical properties and reliability can be obtained. As described above, if at least part of a member to be disposed on the light receiving surface is formed not before the step C of thinning but after the step E of removing the supporting substrate 20, the damage caused to the member disposed on the light receiving surface during the thinning, or the fixation or removal of the supporting substrate 20 can be reduced. Therefore, a photoelectric conversion device having high reliability can be manufactured, and a photoelectric conversion device can be manufactured with a high yield rate.

The light receiving substrate 10 and the circuit substrate 30 are electrically connected to each other. This electrical connection can be achieved outside the chip by wire bonding connection or flip-chip connection. Alternatively, the connection between the light receiving substrate 10 and the circuit substrate 30 can be achieved by a through electrode that is a conductive member that penetrates through the semiconductor layer 100 and/or the semiconductor layer 300 in the chip. Through-silicon via (TSV) technique can be used for the formation of the through electrode.

The formation of the through electrode can be considered in two parts: the formation of a conductive member and the achievement of penetration through the semiconductor layer by the conductive member. In a first example of the formation of the through electrode, after the step C, a through-hole is formed in the semiconductor layer 100 of the light receiving substrate 10 from the opposite side of the light receiving substrate 10 from the supporting substrate 20. Then, a conductive member is formed in the through-hole. A through electrode that is a conductive member that penetrates through the semiconductor layer 100 is thereby formed. After that, step D is performed such that the circuit substrate 30 connects to the through electrode.

In a second example of the formation of the through electrode, after the step E, a through-hole is formed in the semiconductor layer 100 of the light receiving substrate 10 from the opposite side of the light receiving substrate 10 from the circuit substrate 30. Then, a conductive member is formed in the through-hole. A through electrode that is a conductive member that penetrates through the semiconductor layer 100 is thereby formed. Since the through-hole is formed so as to reach the circuit substrate 30, the conductive member penetrating through the semiconductor layer 100 can be connected to the circuit substrate 30.

In a third example of the formation of the through electrode, before the step B, a hole is formed in the semiconductor layer 100 of the light receiving substrate 10. Then, a conductive member is formed in this hole. Then, in step C, the conductive member is exposed on the opposite side of the light receiving substrate 10 from the supporting substrate 20. A through electrode that is a conductive member that penetrates through the semiconductor layer 100 is thereby formed. The conductive member exposed on the opposite side from the supporting substrate 20 can be connected to the circuit substrate 30.

A wafer level chip size package (WLCSP) type photoelectric conversion device can also be manufactured. In the case of a WLCSP type photoelectric conversion device, before the dicing of the stacked body of the light receiving substrate 10 and the circuit substrate 30, the stacked body of the light receiving substrate 10 and the circuit substrate 30 is bonded to a light-transmitting substrate (not shown) such as a glass wafer. At this time, the light receiving substrate 10 is located between the light-transmitting substrate and the circuit substrate 30. Then, the light-transmitting substrate, the light receiving substrate 10, and the circuit substrate 30 are diced together. A photoelectric conversion device in which a light-transmitting substrate, a light receiving substrate, and a circuit substrate are stacked in this order can thereby be obtained.

A chip on board (COB) type photoelectric conversion device can also be manufactured. In the case of a COB type photoelectric conversion device, the stacked body of the light receiving substrate 10 and the circuit substrate 30 is connected to a wiring substrate. At this time, the circuit substrate 30 is located between the light receiving substrate 10 and the wiring substrate. Then, the light receiving substrate 10, the circuit substrate 30, and the wiring substrate are diced together. A photoelectric conversion device in which a light receiving substrate, a circuit substrate, and a wiring substrate are stacked in this order can thereby be obtained. Of course, the WLCSP type and the COB type may be combined to obtain a photoelectric conversion device in which a light-transmitting substrate, a light receiving substrate, a circuit substrate, and a wiring substrate are stacked in this order.

The photoelectric conversion device described above can be used not only as an imaging device (image sensor) used in a camera, but also as a sensor for focus detection (AF: auto focus), a sensor for light metering (AE: auto exposure), and a sensor for focusing.

The camera can include, besides the photoelectric conversion device serving as an imaging device, at least one of a signal processing device, a storage device, a display device, and an optical device. The signal processing device is, for example, a CPU or a DSP, and processes a signal obtained from the imaging device. The storage device is, for example, a DRAM or a flash memory, and stores information based on the signal obtained from the imaging device. The display device is, for example, a liquid crystal display or an organic EL display, and displays information based on the signal obtained in the imaging device. The optical device is, for example, a lens, a shutter, or a filter, and guides light to the imaging device. The term "camera" as used herein includes, besides a dedicated camera such as a still camera, a video camera, or a surveillance camera, an information terminal having shooting function, and a moving body (a vehicle or a flying body) having shooting function.

Exemplary embodiments 1 to 3 will be described in detail below. The redundant description of matters common to Exemplary embodiments 1 to 3 will be omitted.

Exemplary Embodiment 1

The step shown in FIGS. 2A to 2C corresponds to step A described with reference to FIG. 1A.

As shown in FIG. 2A, a semiconductor wafer having a semiconductor layer 100 is prepared.

Figure 2B:
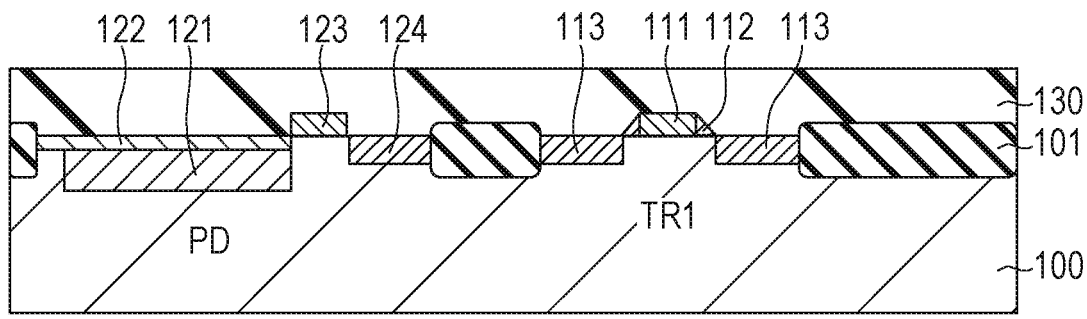

In the step shown in FIG. 2B, an element isolation portion 101 that defines an element portion (active portion) of the semiconductor layer 100 is formed. The element isolation portion 101 may be formed of a field insulating film such as a silicon oxide film, and may be formed by any one of LOCOS and STI and other oxide forming techniques. A photoelectric conversion element PD that is a photodiode and a semiconductor element TR1 that is a transistor are formed on the semiconductor layer 100. The semiconductor element TR1 has a gate 111 having a MOS structure, side spacers 112, and source and drain impurity regions 113. The well, gate insulating film, and impurity region for LDD are omitted to avoid complicating the figure. The photoelectric conversion element PD that is a photodiode includes an n-type impurity region 121 that is an electric charge accumulation region, and a p-type impurity region around it. A p-type impurity region 122 is provided between the impurity region 121 and the surface of the semiconductor layer 100, and the photoelectric conversion element PD is thereby a buried type photodiode. A transfer gate 123 transfers electric charge (electrons) to an n-type impurity region 124 that is a floating diffusion region.

Figure 2C:
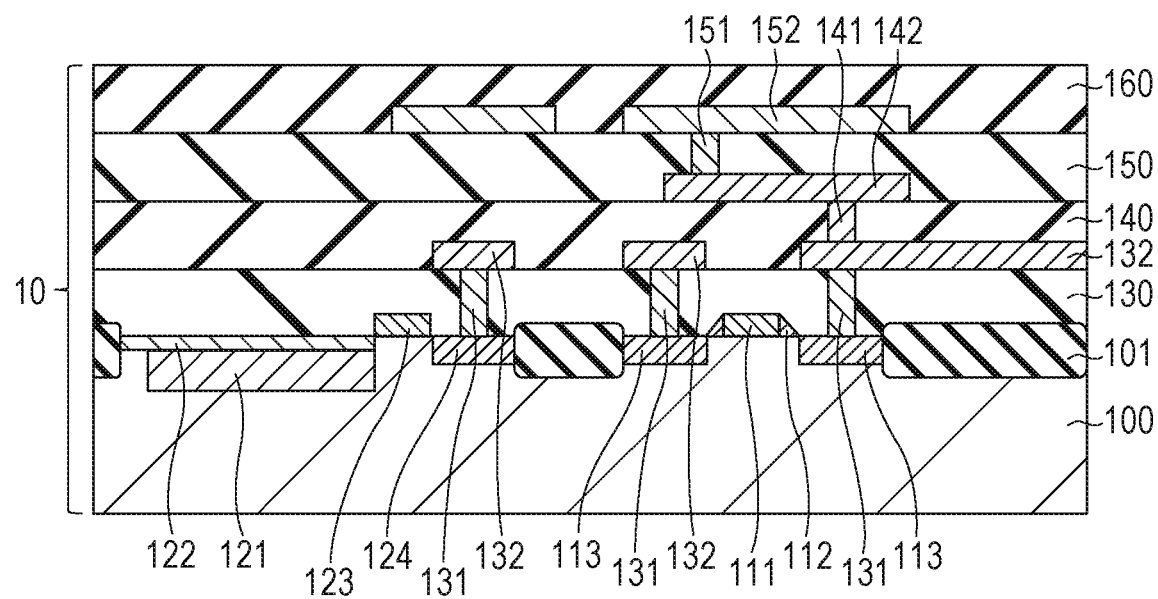

In the step shown in FIG. 2C, a light receiving substrate 10 is formed. The light receiving substrate 10 has a wiring member on the semiconductor layer 100. The wiring member includes an interlayer insulating layer 130, and contact plugs 131 penetrating through the interlayer insulating layer 130. The wiring member further includes a first wiring layer 132, an interlayer insulating layer 140 on the first wiring layer 132, a first via plug 141 between the first wiring layer 132 and a second wiring layer 142, and the second wiring layer 142. The wiring member further includes an interlayer insulating layer 150 on the second wiring layer 142, a second via plug 151 between the second wiring layer 142 and a third wiring layer 152, the third wiring layer 152, and an insulator film 160 serving as a passivation film on the third wiring layer 152. Thus, the light receiving substrate 10 has been processed up to formation of the insulator film 160 serving as a passivation film on the third wiring layer 152. In this way, the light receiving substrate 10 is prepared.

Figure 2D:
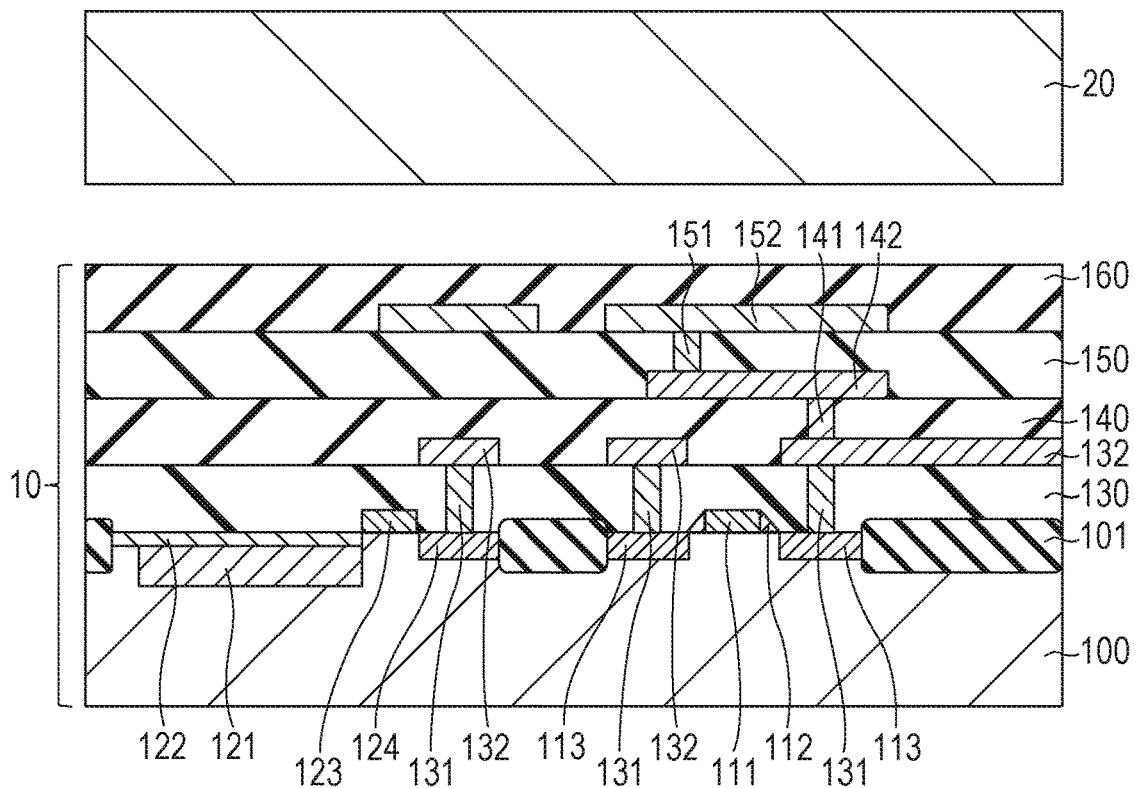
Figure 2E:
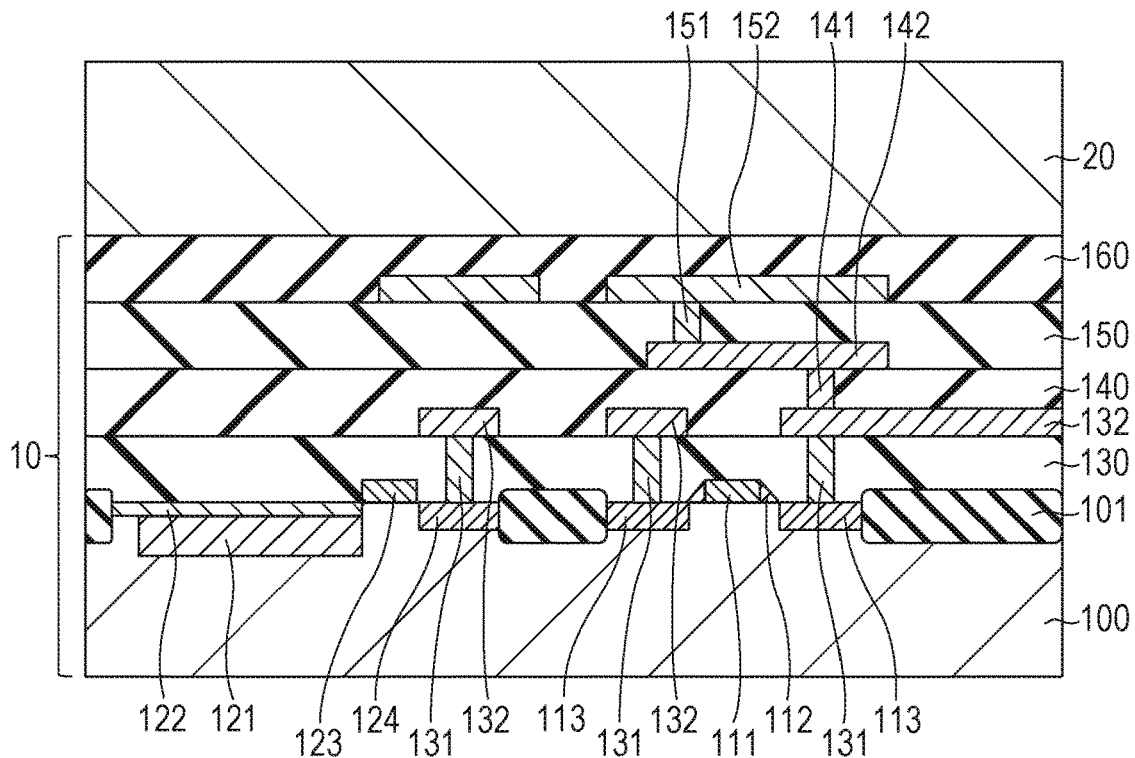

The step shown in FIGS. 2D and 2E corresponds to step B described with reference to FIG. 1B. FIG. 2D shows a state before the bonding of the light receiving substrate 10 that has been processed up to formation of the insulator film 160 serving as a passivation film, and a supporting substrate 20. FIG. 2E shows a state after the bonding of the light receiving substrate 10 and the supporting substrate 20. The light receiving substrate 10 and the supporting substrate 20 may be bonded directly or with various adhesives. The supporting substrate 20 may be a silicon wafer or a glass wafer. However, considering warpage due to the difference in thermal expansion coefficient, when the light receiving substrate 10 is a silicon wafer, the supporting substrate 20 is preferably also a silicon wafer.

Figure 3A:
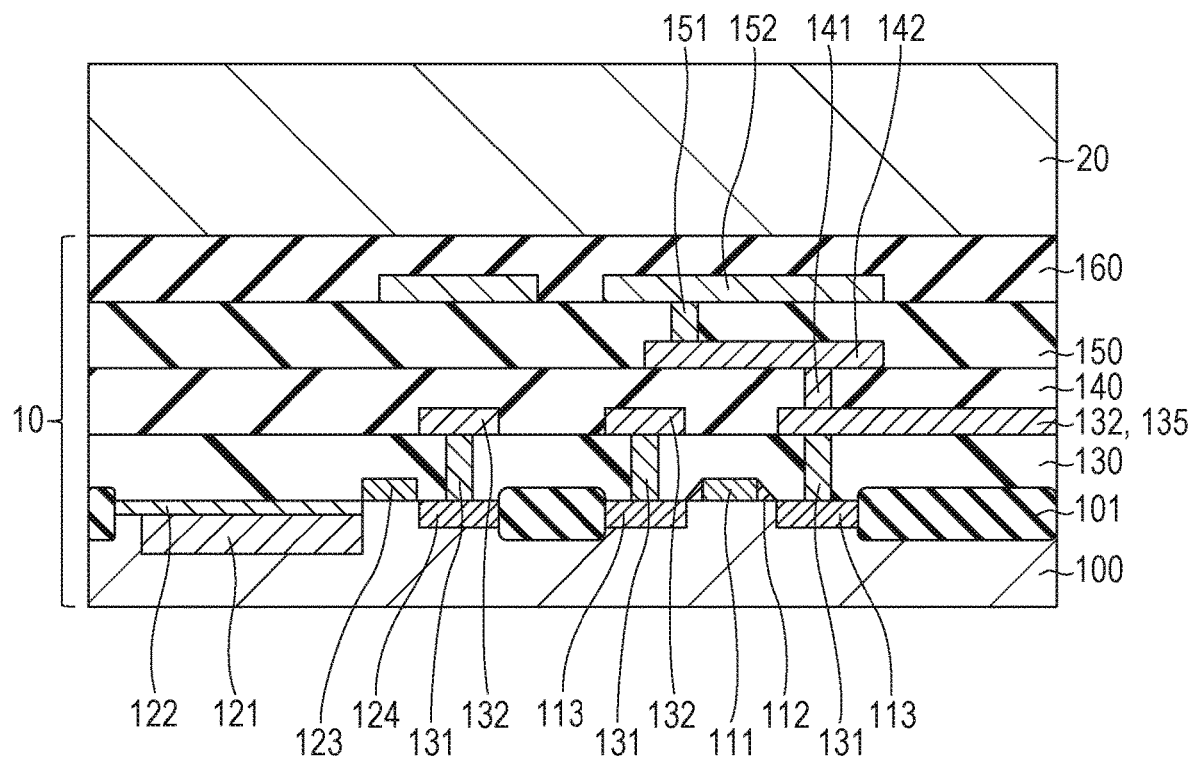
FIGS. 3A to 3D are schematic views illustrating Exemplary embodiment 1 of the method for manufacturing a photoelectric conversion device.

The step shown in FIG. 3A corresponds to step C described with reference to FIG. 1C. FIG. 3A shows a state in which the light receiving substrate 10 is thinned by back grinding (BG), chemical mechanical polishing (CMP), wet etching and/or other methods of thinning the light receiving substrate 10. Specifically, part of the semiconductor layer 100 of the light receiving substrate 10 is removed, and the semiconductor layer 100 is thinned. It is advantageous in a subsequent etching step for forming a hole for a through electrode, that the thickness of the semiconductor layer 100 is small. However, if the semiconductor layer 100 is too thin, the photodiode properties are affected. The thickness of the semiconductor layer 100 after thinning is preferably greater than or equal to 5 µm, and more preferably greater than 10 µm. The thickness of the semiconductor layer 100 after thinning is preferably less than 100 µm, and more preferably less than or equal to 50 µm. When the distance between the back surface of the semiconductor layer 100 that appears after thinning and the front surface serving as a light receiving surface is greater than 10 µm, the effect of noise generated in the vicinity of the back surface can be reduced.

FIGS. 3B to 4B show the step of forming a through electrode.

Figure 3B:
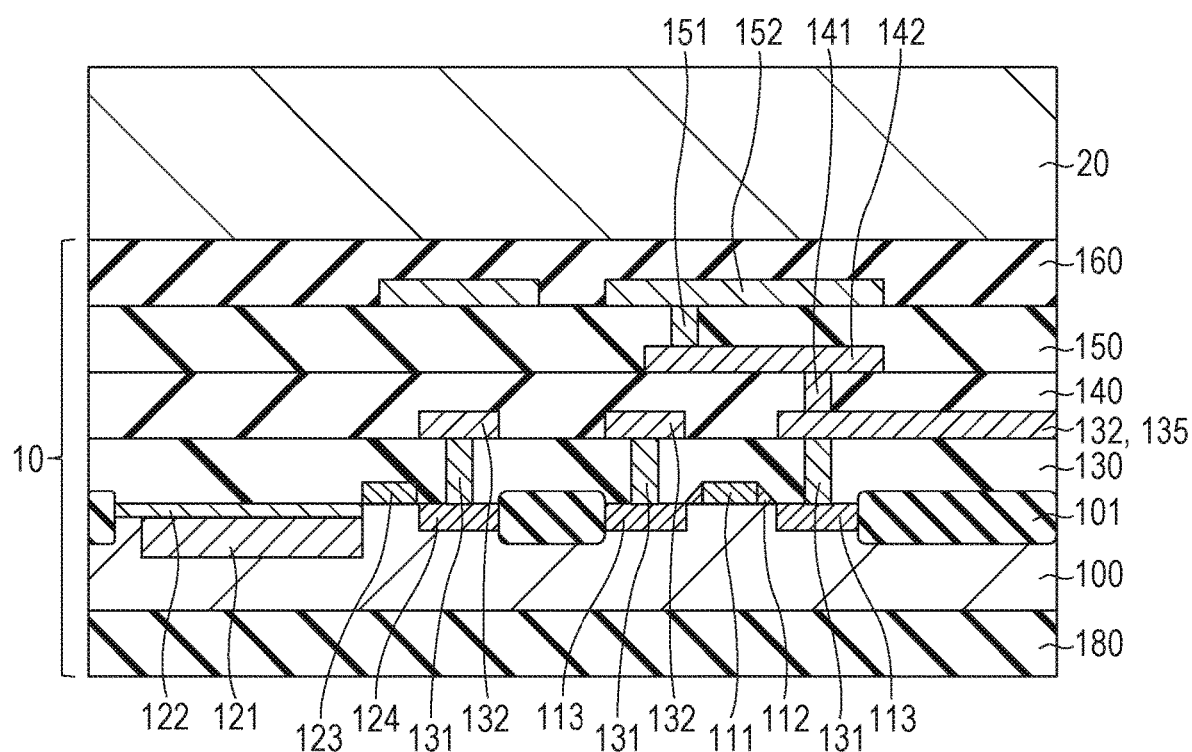

FIG. 3B shows the step of forming an insulating film 180 on the back surface (polished surface) after the thinning of the light receiving substrate 10.

Figure 3C:
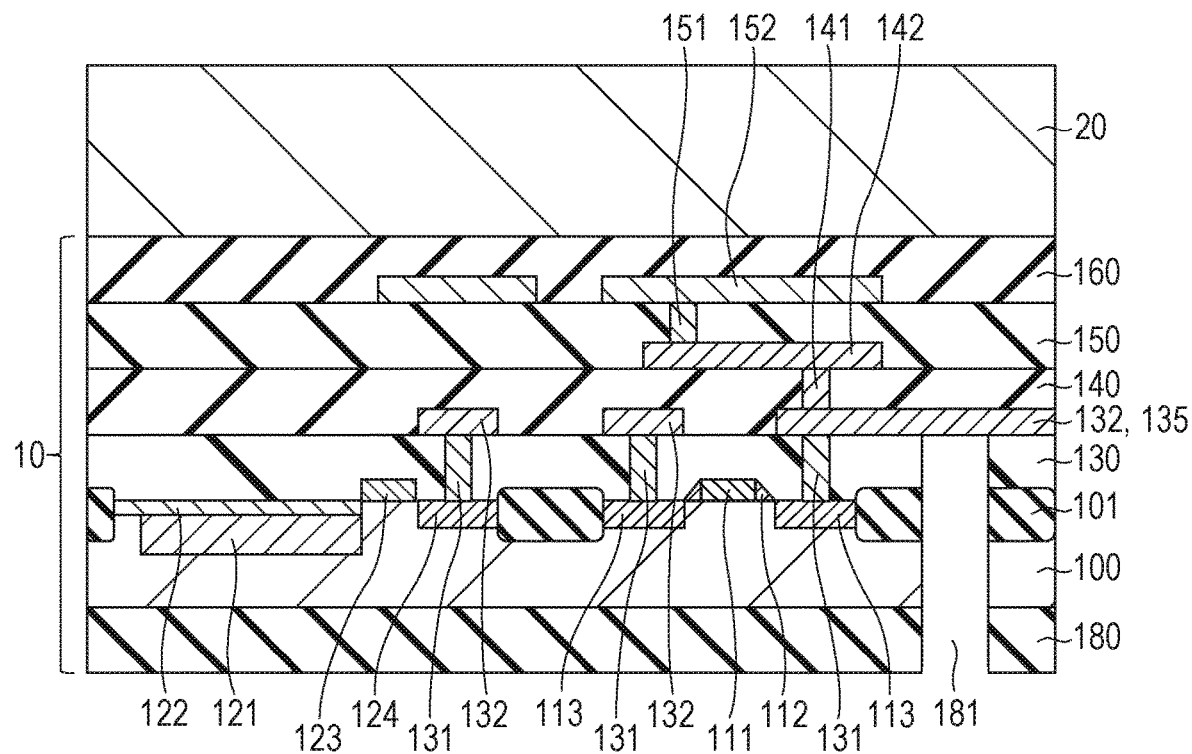

FIG. 3C shows the step of forming a through-hole 181 in the semiconductor layer 100. A resist is applied to the back surface of the light receiving substrate 10, and the resist is exposed and developed to form a mask. By dry-etching the semiconductor layer 100 using the mask, a through-hole 181 reaching the connecting electrode 135 of the first wiring layer 132 is formed. In order for the through-hole 181 to reach the connecting electrode 135, following the etching of the semiconductor layer 100, the field insulating film of the element isolation portion 101 and the interlayer insulating layer 130 are also etched. FIG. 3C shows a state in which, after the formation of the through-hole 181, the resist mask is removed.

Figure 3D:
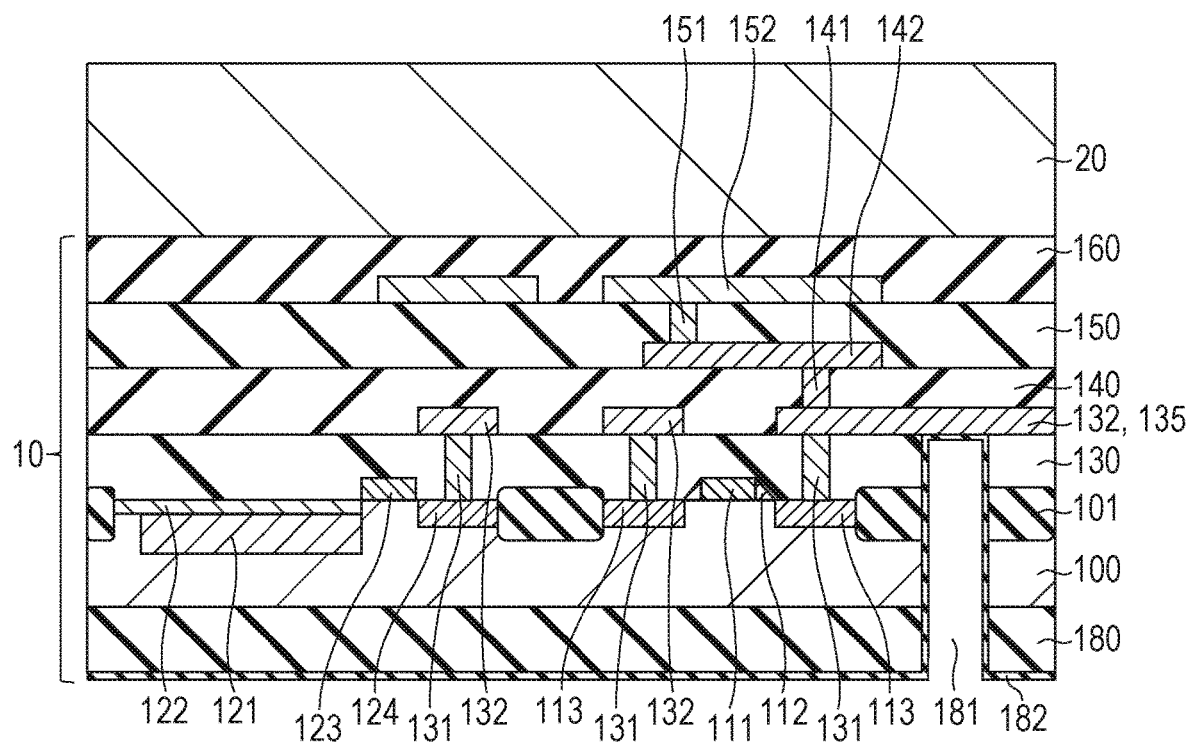

FIG. 3D shows a state in which an insulating film 182 is formed on the inner surface of the through-hole 181 and the back surface of the semiconductor layer 100.

Figure 4A:
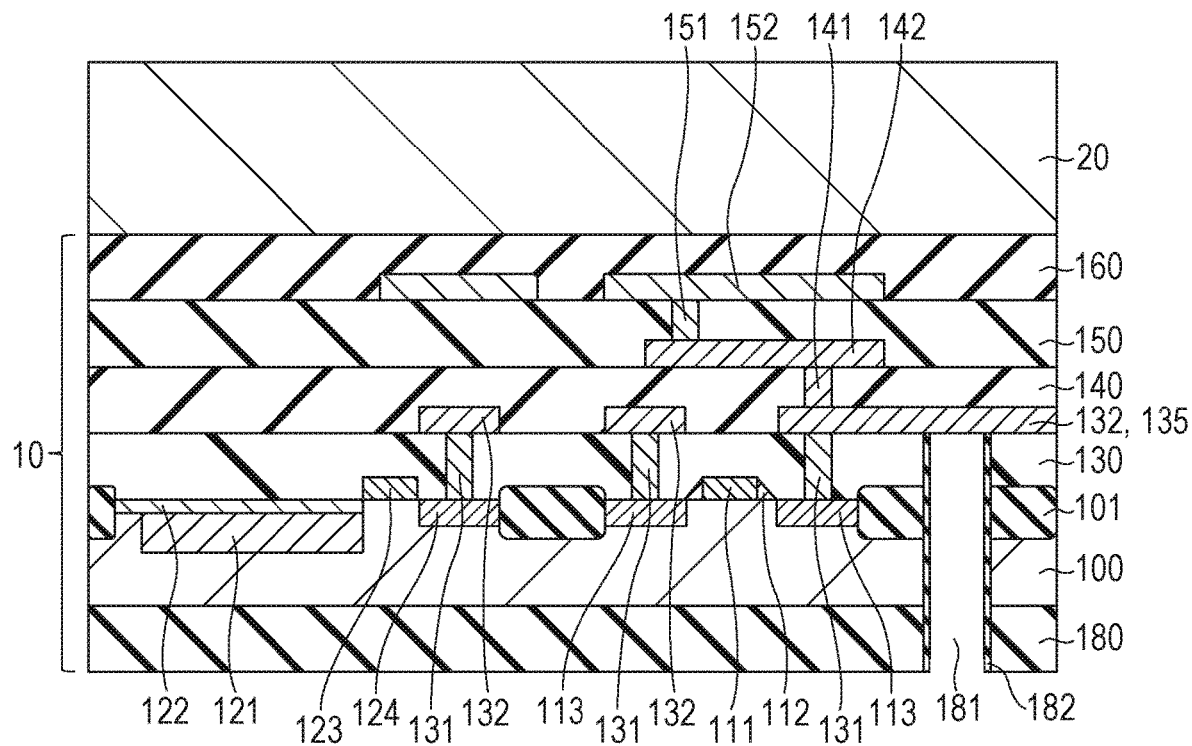
FIGS. 4A to 4C are schematic views illustrating Exemplary embodiment 1 of the method for manufacturing a photoelectric conversion device.

FIG. 4A shows a state in which a part of the insulating film 182 that is located on the bottom of the through-hole 181 (on the connecting electrode 135) is removed by anisotropic etching. A part of the insulating film 182 that is located on the back surface of the semiconductor layer 100 is also removed. These steps are performed to achieve the insulation between a conductive member to be embedded in the through-hole 181 and the semiconductor layer 100, and the conduction with the connecting electrode 135.

Figure 4B:
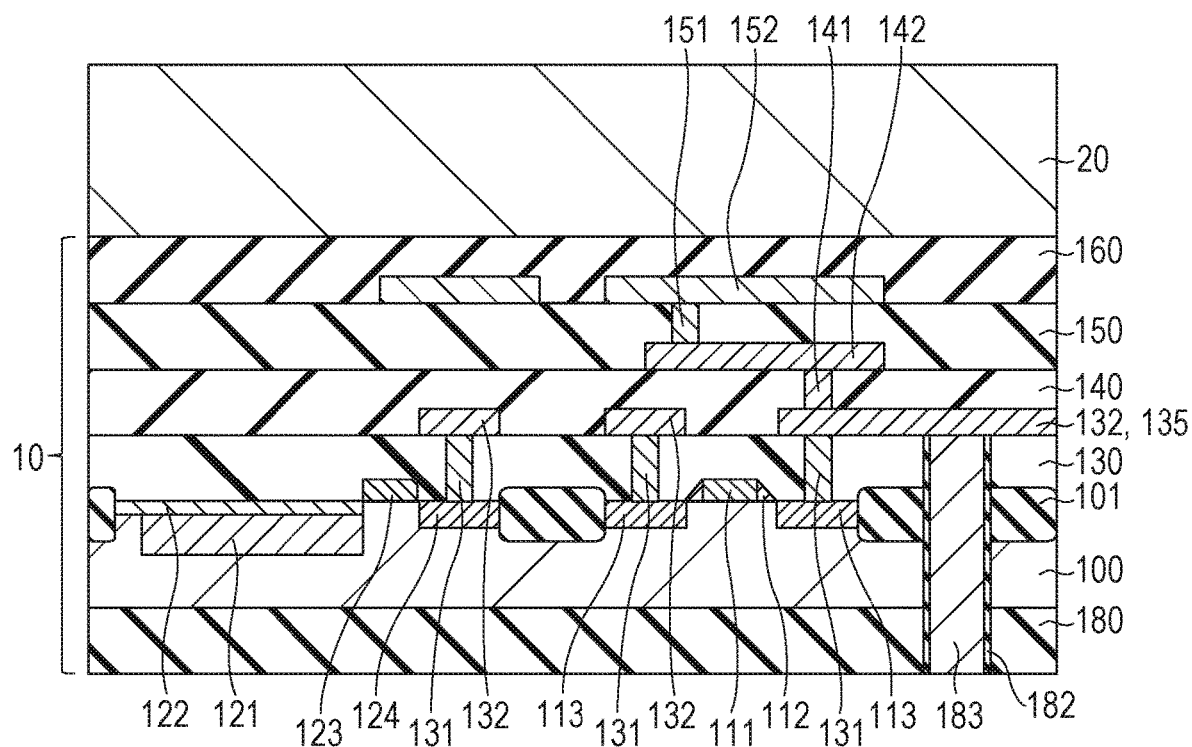

FIG. 4B shows the step of embedding a conductive member 183 in the through-hole 181. The conductive member 183 can be formed by forming conductive material by the formation of a copper seed layer and a copper plating layer, and then removing excess conductive material outside the through-hole 181 by CMP.

Figure 4C:
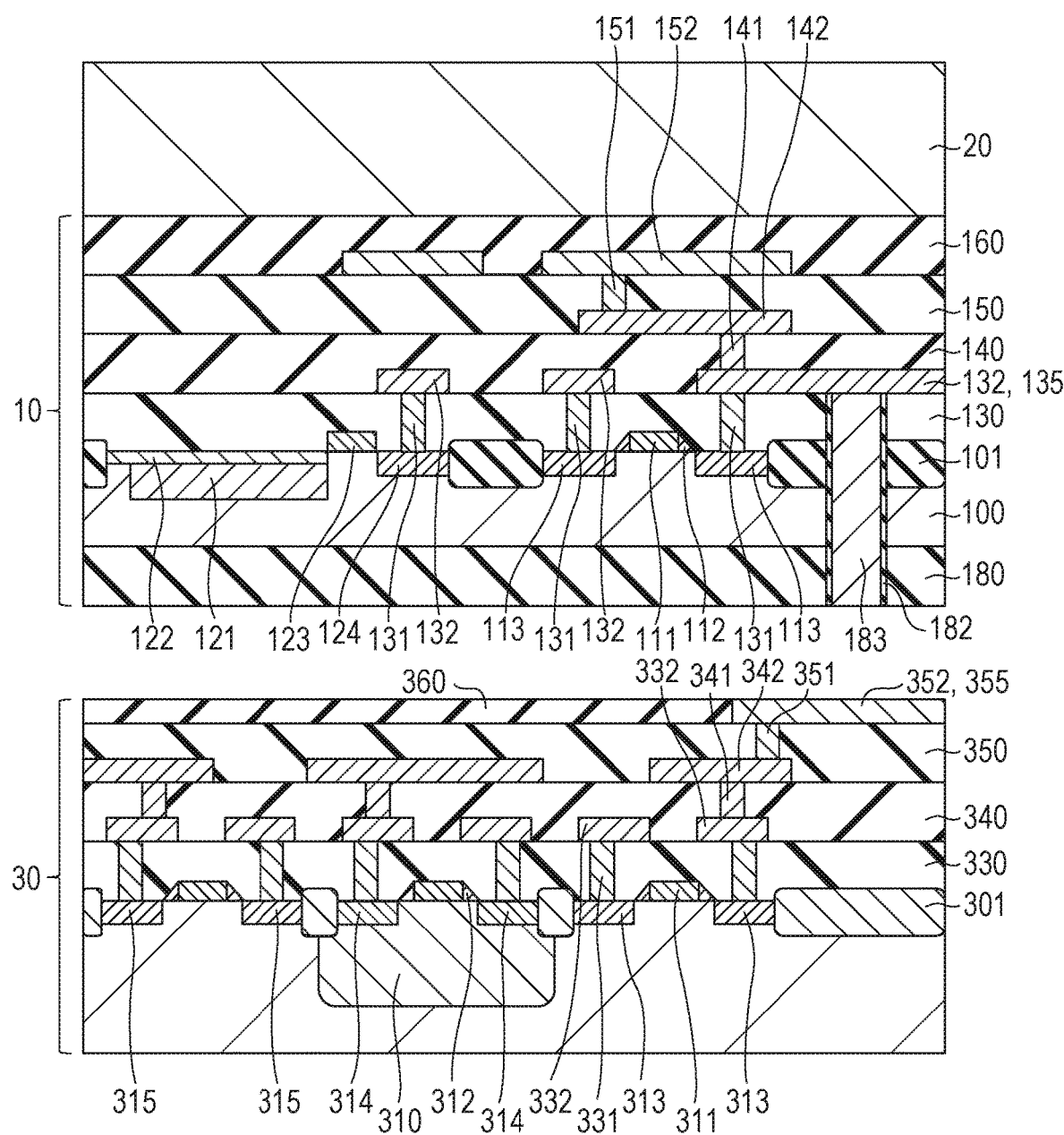

The step shown in FIG. 4C and FIG. 5A corresponds to step D described with reference to FIG. 1D. FIG. 4C shows a state before the bonding of the light receiving substrate 10 and a separately prepared circuit substrate 30. The circuit substrate 30 includes a semiconductor layer 300. Various semiconductor elements such as semiconductor elements TR2, TR3, and TR4 that are transistors, resistive elements, and capacitive elements are formed on the semiconductor layer 300. The circuit substrate 30 is provided with a peripheral circuit that is a circuit other than a pixel circuit, as a semiconductor integrated circuit. The peripheral circuit can include a drive circuit that drives the pixel circuit, an analog signal processing circuit that processes an analog signal from the pixel circuit, an AD conversion circuit that converts an analog signal into a digital signal, and a digital signal processing circuit that processes a digital signal. The semiconductor elements TR2, TR3, and TR4 each have a gate 311 having a MOS structure, and side spacers 312. The semiconductor elements TR2, TR3, and TR4 have source and drain impurity regions 313, 314, and 315. The semiconductor element TR3 is disposed in an n-type well 310. The depiction of the gate insulating film is omitted. The semiconductor elements TR2, TR3, and TR4 may be provided with impurity regions for LDD and impurity regions for HALO, though the depiction thereof is omitted. A silicide layer containing cobalt silicide or nickel silicide can be formed by a salicide process on the gate, source, and drain of the semiconductor elements TR2, TR3, and TR4, though the depiction thereof is omitted.

A wiring member is formed on the semiconductor layer 300. The wiring member includes contact plugs 331, a first wiring layer 332, via plugs 341, a second wiring layer 342, a via plug 351, and a third wiring layer 352. Interlayer insulating layers 330, 340, and 350 are disposed between these wiring layers. Copper wiring having a damascene structure can be used as the wiring member. An insulator film 360 serving as a passivation film is also provided. A connecting electrode 355 included in the third wiring layer 352, which is the uppermost wiring layer, is exposed.

Figure 5A:
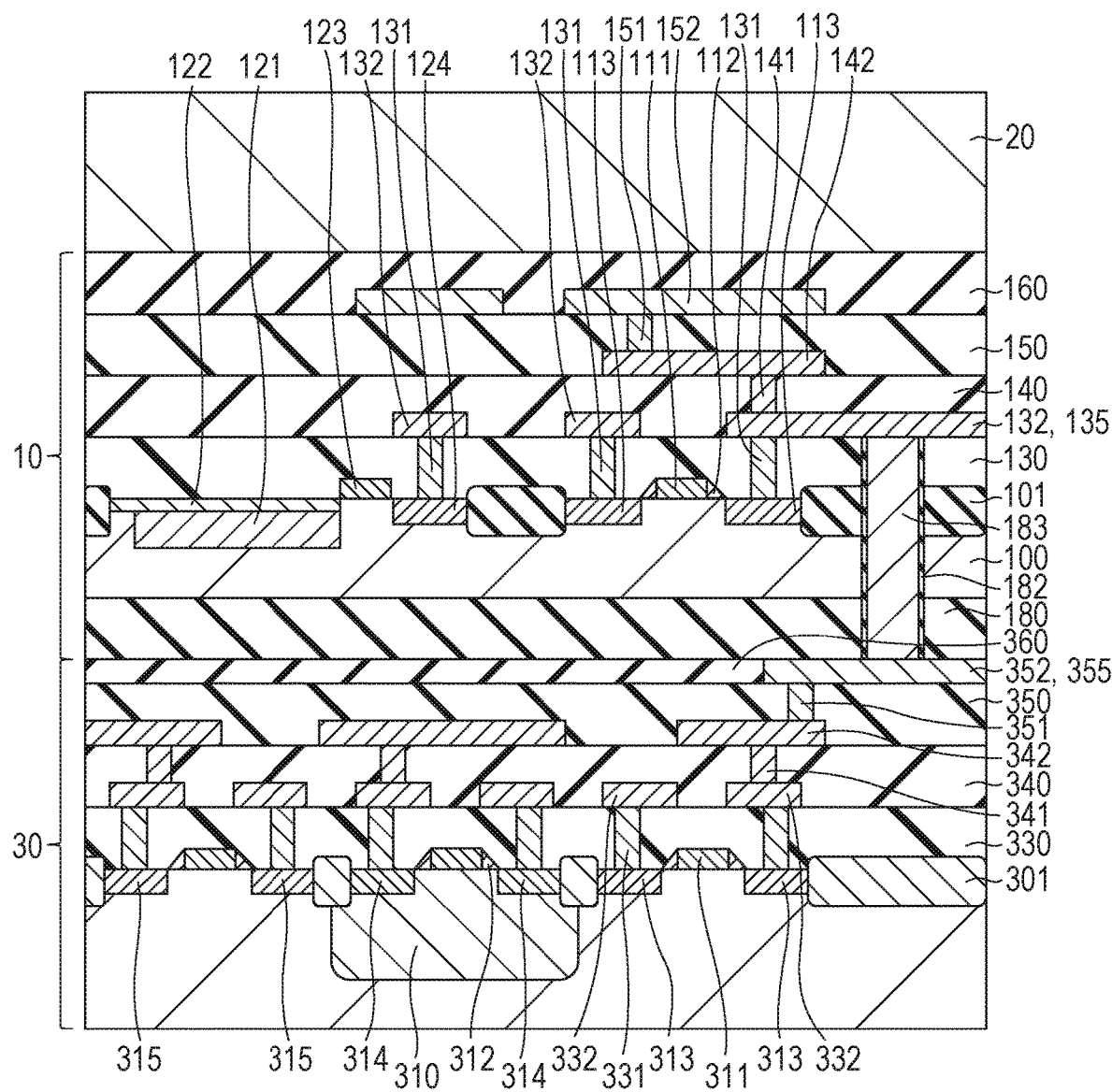
FIGS. 5A to 5C are schematic views illustrating Exemplary embodiment 1 of the method for manufacturing a photoelectric conversion device.

FIG. 5A shows a state after the bonding of the circuit substrate 30 that has been processed up to formation of the insulator film 360 serving as a passivation film, and the light receiving substrate 10 and the supporting substrate 20. The light receiving substrate 10 and the circuit substrate 30 may be bonded directly or with various adhesives. By bonding the back surface of the light receiving substrate 10 and the front surface of the circuit substrate 30, the connecting electrode of the first wiring layer 132 of the light receiving substrate 10 and the connecting electrode 355 of the circuit substrate 30 are electrically connected through the conductive member 183.

Figure 5B:
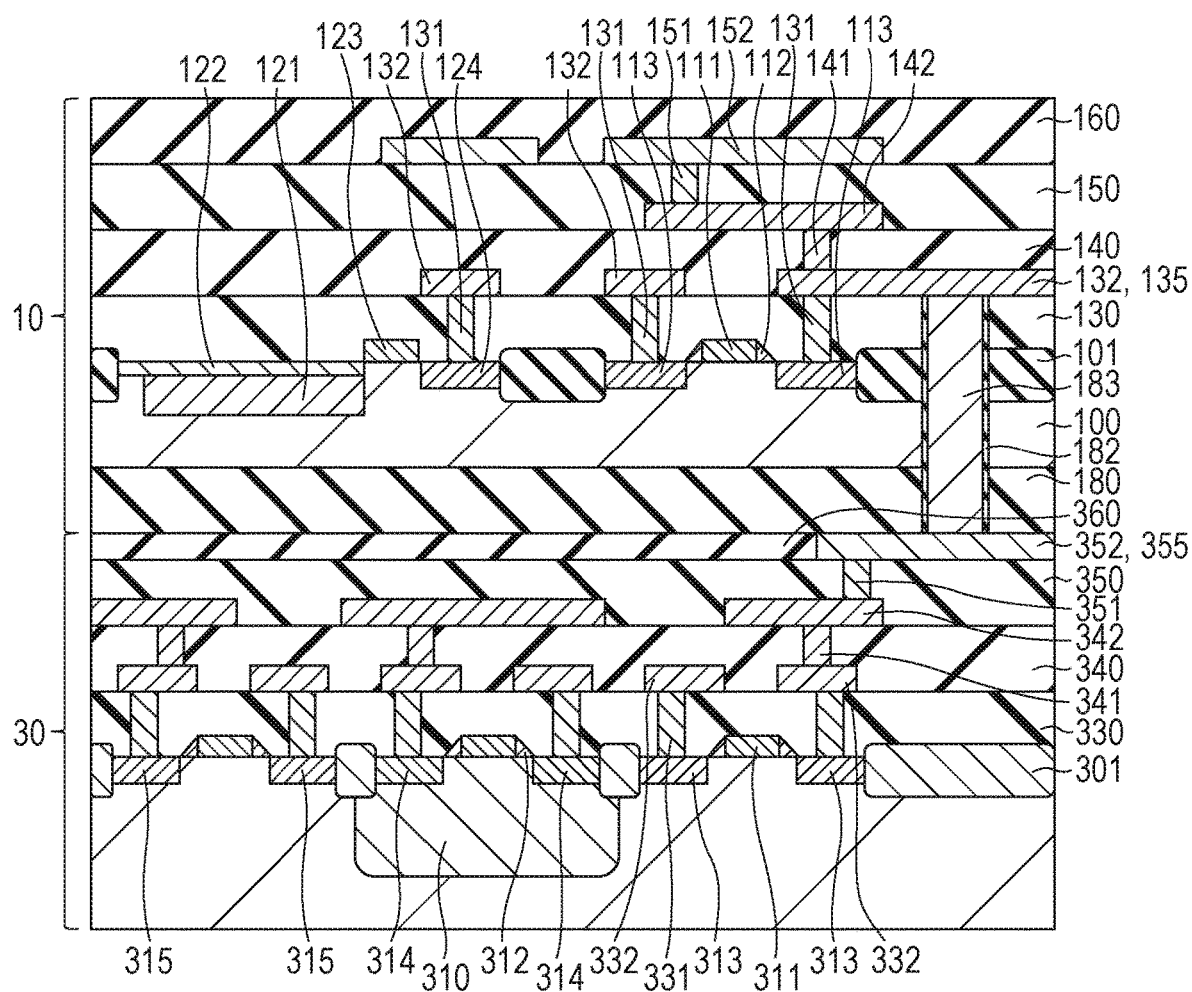

The step shown in FIG. 5B corresponds to step E described with reference to FIG. 1E. The supporting substrate 20 is removed from the light receiving substrate 10. The supporting substrate 20 may be removed by any one of stripping, mechanical polishing, chemical mechanical polishing, and wet etching.

Figure 5C:
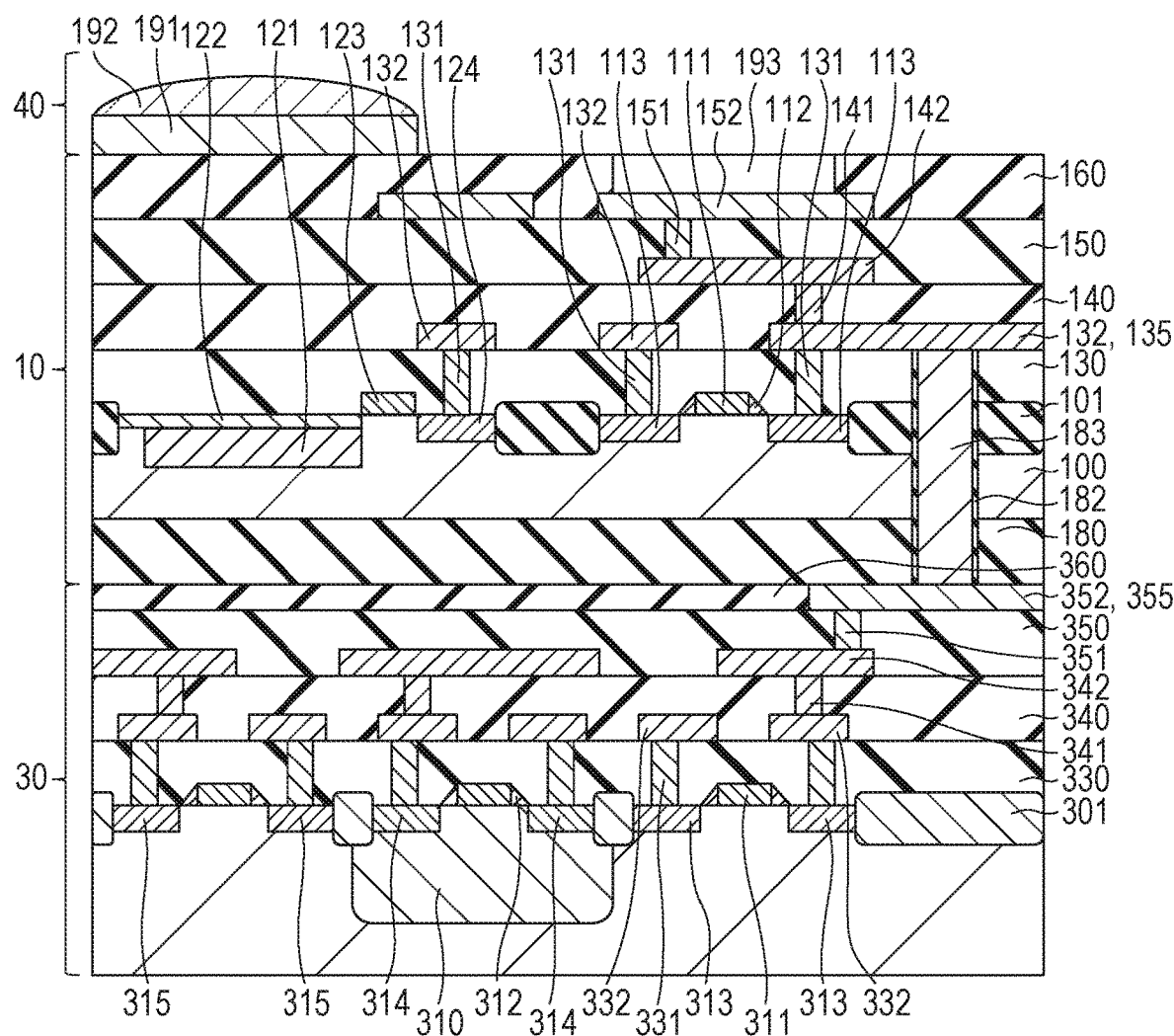

The step shown in FIG. 5C corresponds to step F described with reference to FIG. 1F. A color filter 191 and a microlens 192 are formed, and an opening 193 is formed in the insulator film 160. After that, the wafer is diced into chips, and packaging is performed as needed.

Thus, a front side illumination (FSI) photoelectric conversion device in which a light receiving substrate 10 and a circuit substrate 30 are stacked is completed.

In Exemplary embodiment 1, since the through electrode extends from the connecting electrode 355 of the circuit substrate 30 to the first wiring layer 132, the number of etching objects is small, that is, only the insulating film 180, the semiconductor layer 100, the field insulating film of the element isolation portion 101, and the interlayer insulating layer 130 are to be etched. This is advantageous in favorably forming the through-hole 181.

In Exemplary embodiment 1, the conductive member 183 is connected to the connecting electrode 135 included in the first wiring layer 132. However, if the processing of the through-hole 181 is possible, the conductive member 183 may be connected to a connecting electrode included in any wiring layer.

Figure 6A:
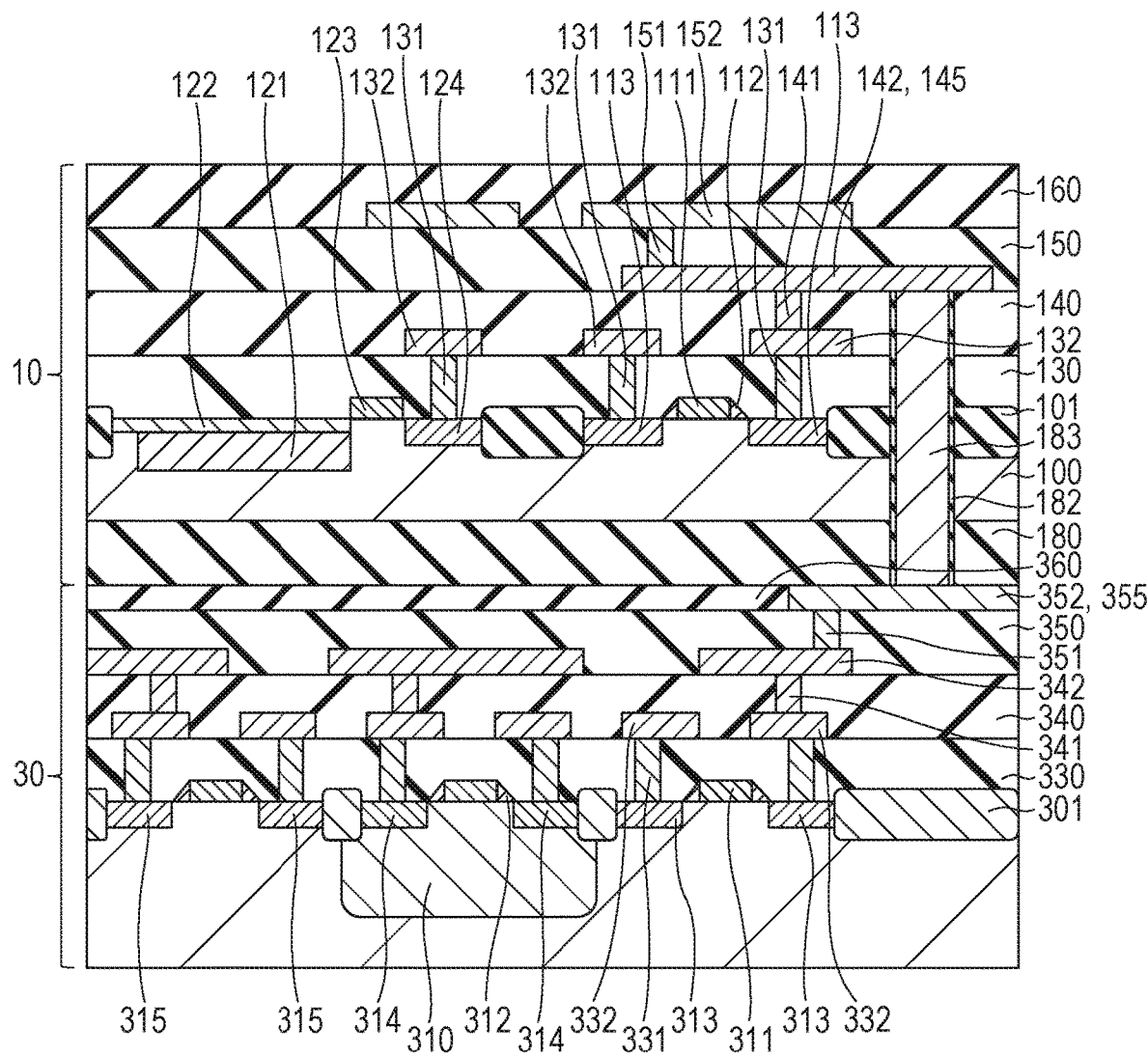
FIGS. 6A and 6B are schematic views illustrating modifications of the method for manufacturing a photoelectric conversion device.

FIG. 6A shows a first modification of Exemplary embodiment 1. In the first modification, the conductive member 183 is connected to a connecting electrode 145 included in the second wiring layer 142.

Figure 6B:
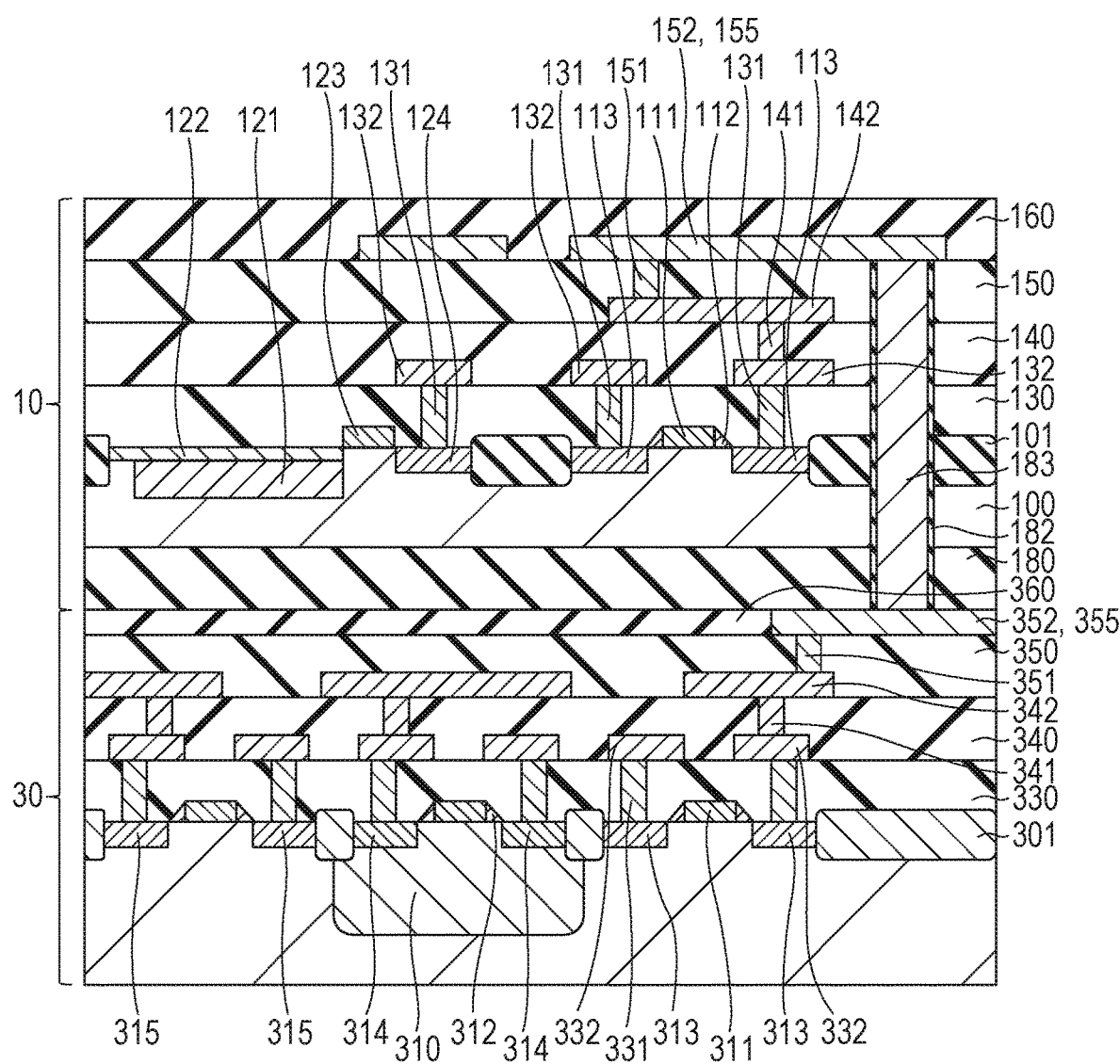

FIG. 6B shows a second modification of Exemplary embodiment 1. In the second modification, the conductive member 183 is connected to a connecting electrode 155 included in the third wiring layer 152.

Exemplary Embodiment 2

Figure 7A:
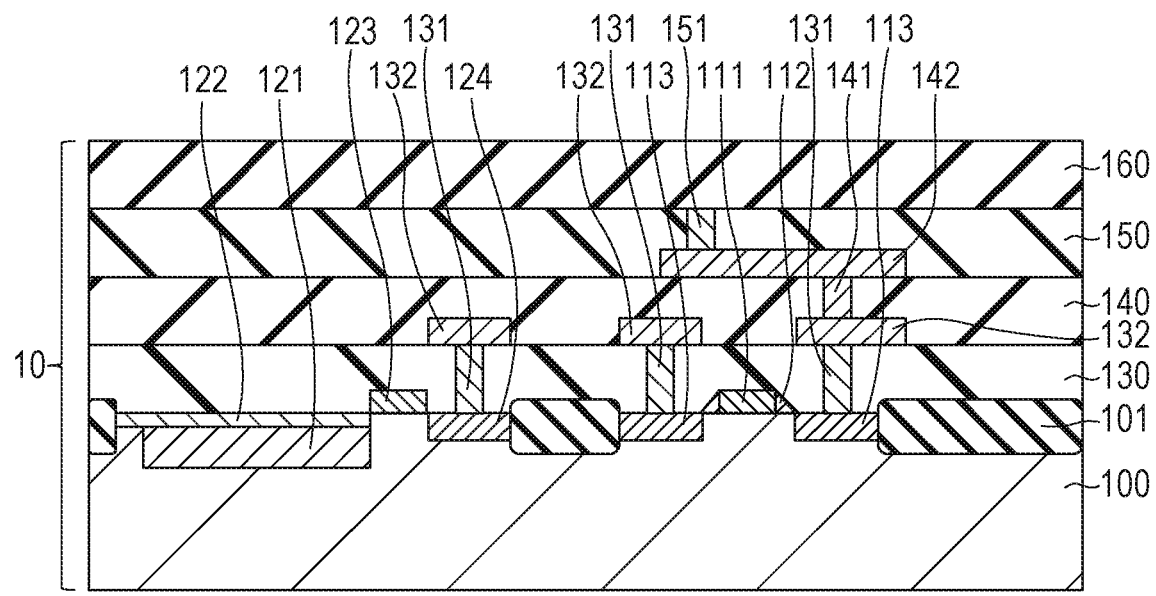
FIGS. 7A to 7D are schematic views illustrating Exemplary embodiment 2 of the method for manufacturing a photoelectric conversion device.

The step shown in FIG. 7A corresponds to step A described with reference to FIG. 1A. The light receiving substrate 10 has been processed up to formation of the via plug 151 and the insulator film 160. Exemplary embodiment 2 differs from Exemplary embodiment 1 in that the third wiring layer 152 is not formed.

Figure 7B:
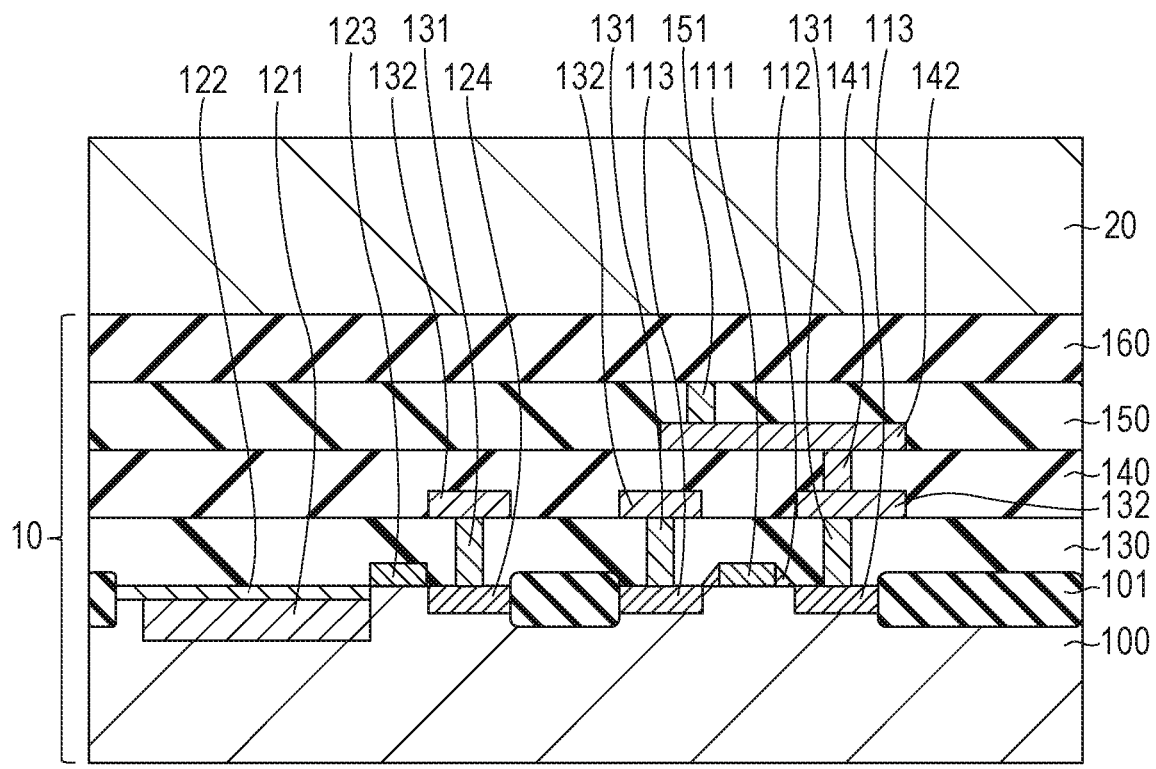

The step shown in FIG. 7B corresponds to step B described with reference to FIG. 1B. The supporting substrate 20 is bonded to the light receiving substrate 10, and the light receiving substrate 10 and the supporting substrate 20 are fixed to each other.

Figure 7C:
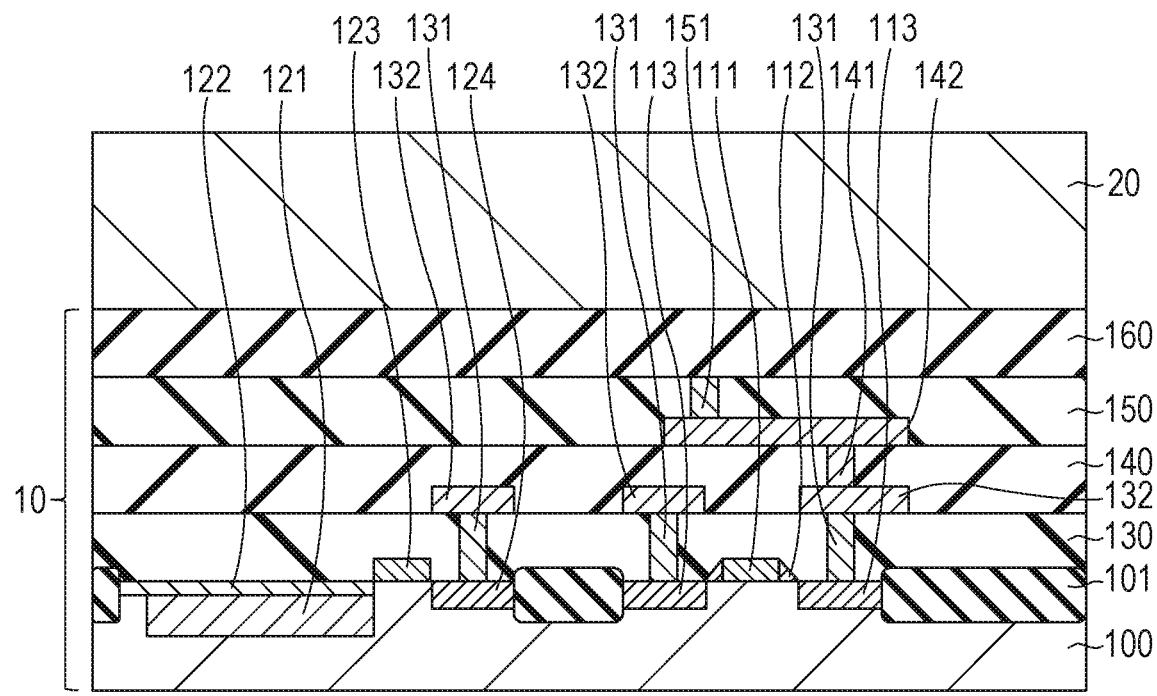

The step shown in FIG. 7C corresponds to step C described with reference to FIG. 1C. The light receiving substrate 10 is thinned by mechanical polishing (MP), chemical mechanical polishing (CMP), or wet etching.

Figure 7D:
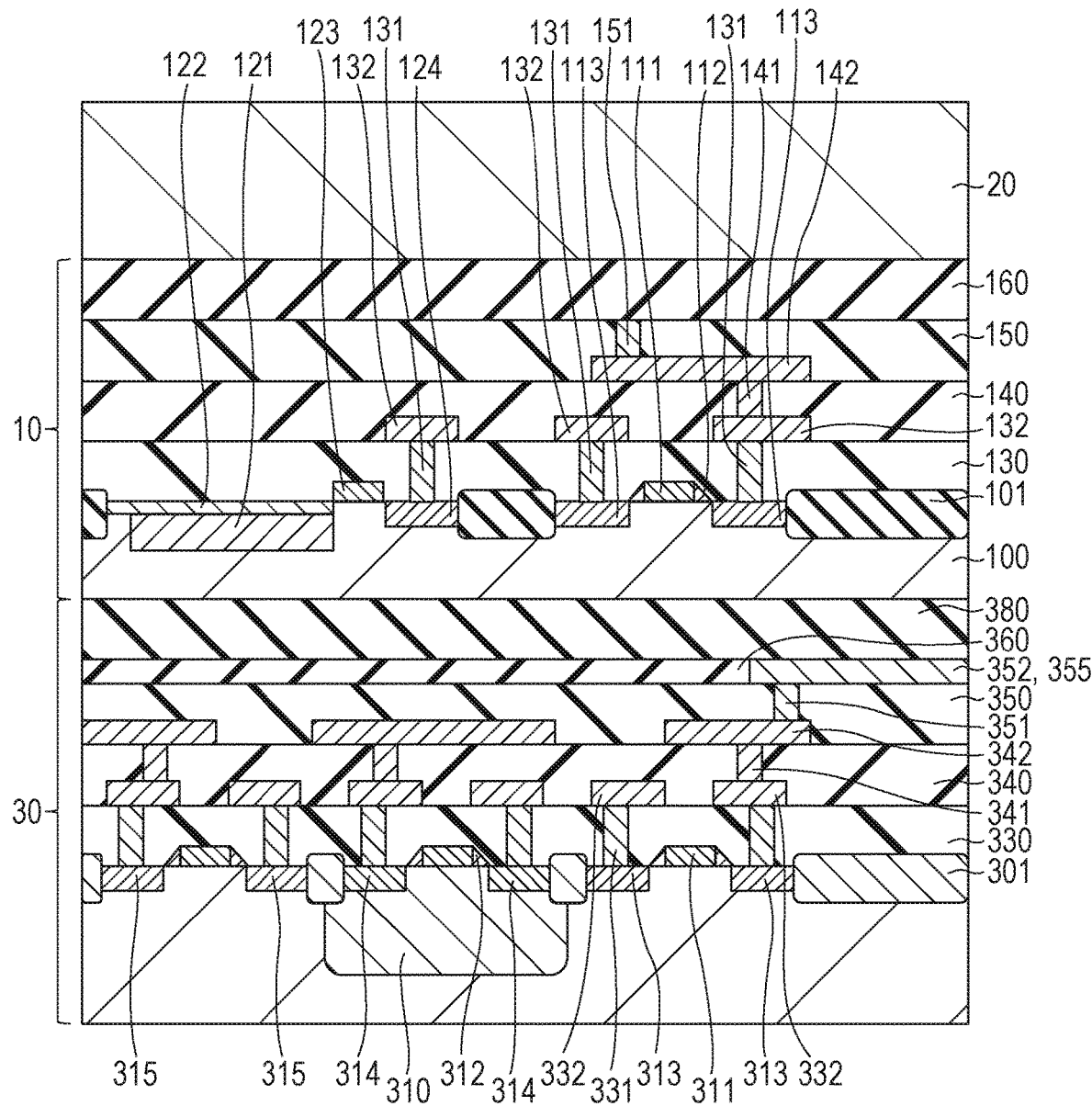

The step shown in FIG. 7D corresponds to step D described with reference to FIG. 1D. In Exemplary embodiment 2, the connecting electrode 355 of the circuit substrate 30 is covered with an insulating film 380. The insulating film 380 is provided on the circuit substrate 30 before the bonding of the light receiving substrate 10 and the circuit substrate 30. In this exemplary embodiment, an insulating film corresponding to the insulating film 180 in Exemplary embodiment 1 is omitted so that the insulating film 380 and the semiconductor layer 100 are in contact with each other. An insulating film 180 may be provided on the semiconductor layer 100, and the insulating film 180 and the insulating film 380 may be bonded directly or with adhesive.

Figure 8A:
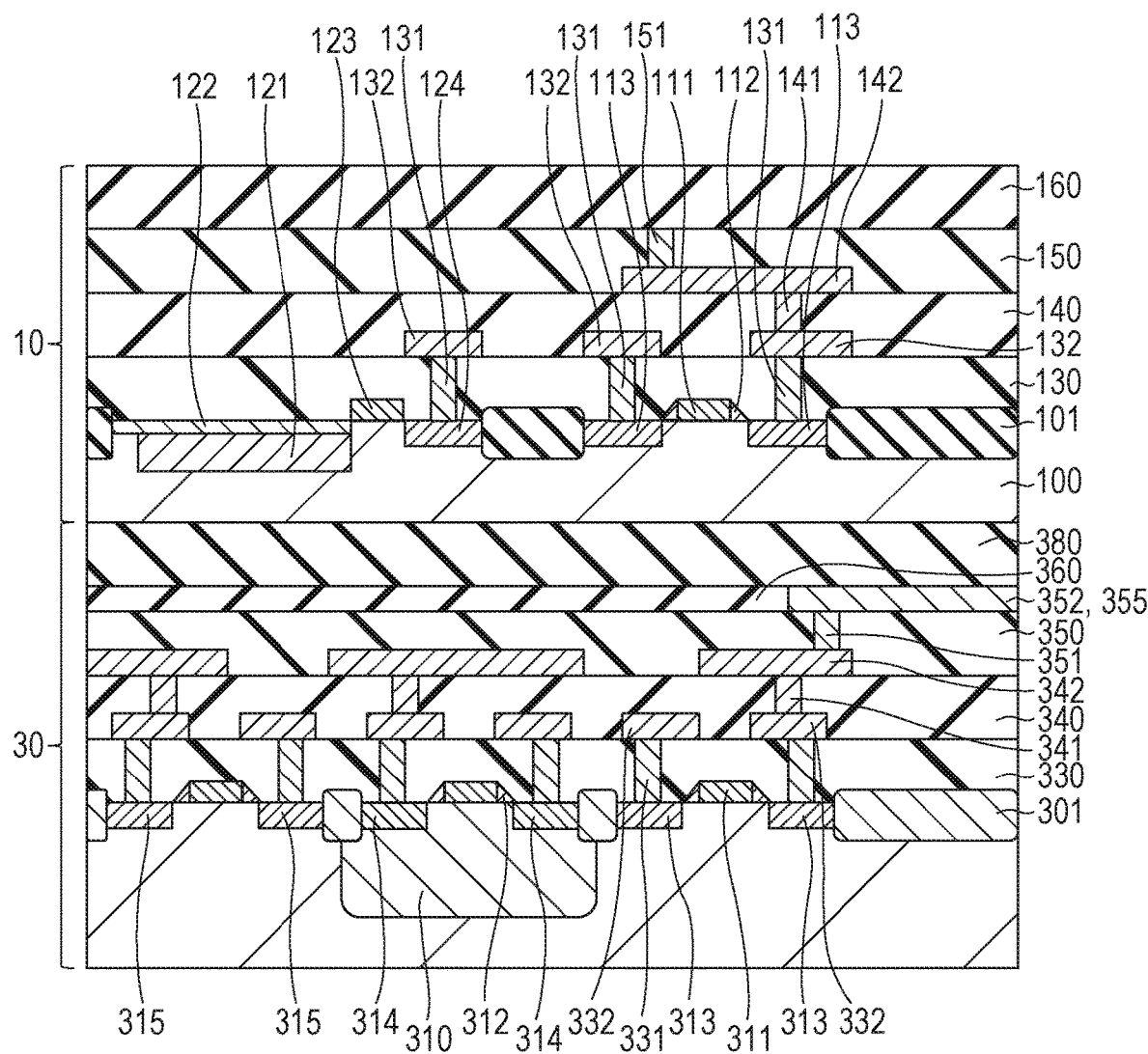
FIGS. 8A to 8C are schematic views illustrating Exemplary embodiment 2 of the method for manufacturing a photoelectric conversion device.

The step shown in FIG. 8A corresponds to step E described with reference to FIG. 1E. The supporting substrate 20 is removed from the light receiving substrate 10.

The step shown in FIG. 8B to FIG. 9A is the step of forming a through electrode.

Figure 8B:
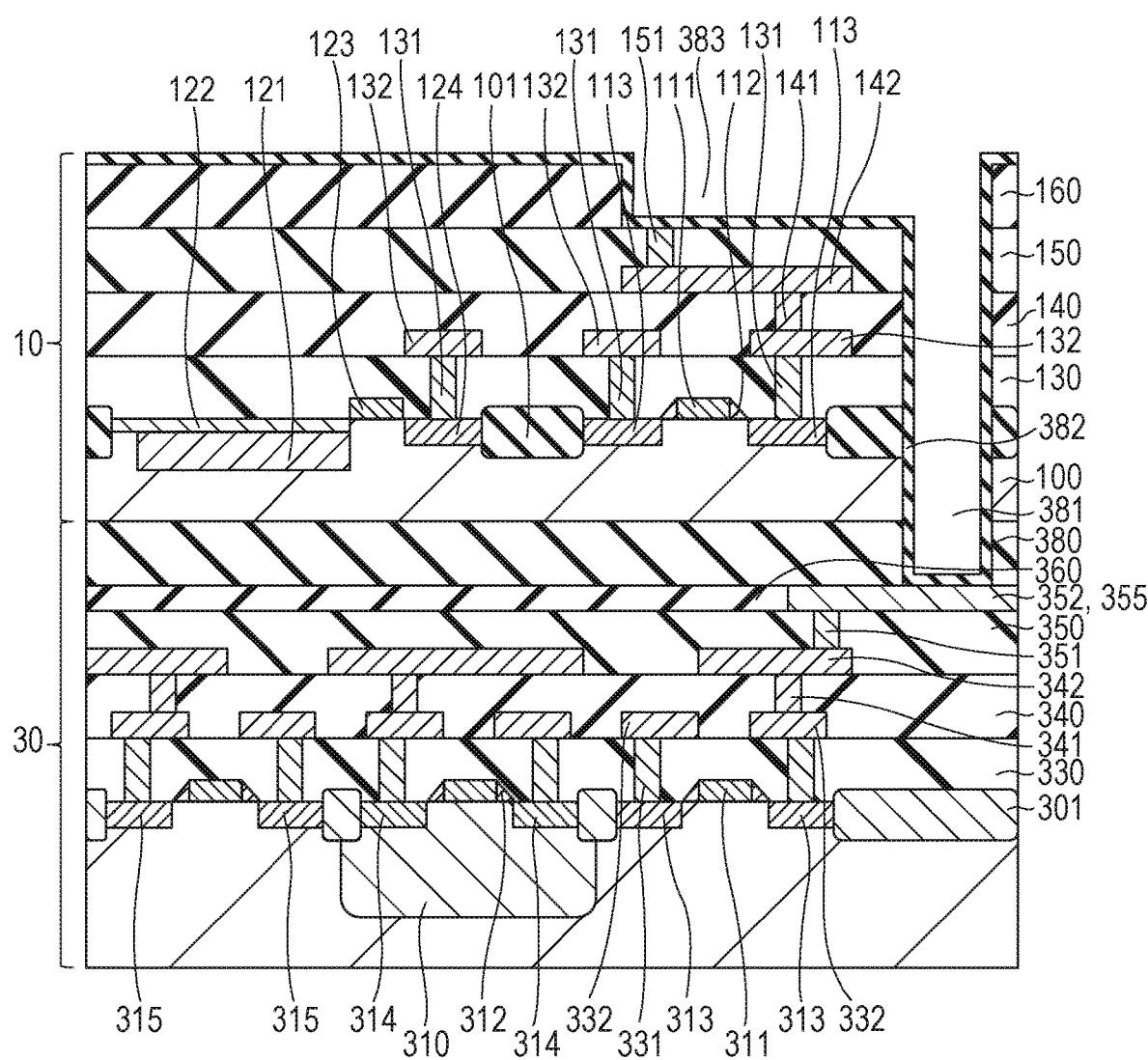

In the step shown in FIG. 8B, a through-hole 381 that penetrates through the semiconductor layer 100 is formed from the opposite side of the light receiving substrate 10 from the circuit substrate 30.

A resist is applied to the back surface of the light receiving substrate 10, and the resist is exposed and developed to form a mask. By dry-etching the semiconductor layer 100 using the mask, a through-hole 381 reaching the connecting electrode 355 of the third wiring layer 352 is formed. Before the etching of the semiconductor layer 100, the insulator film 160, the interlayer insulating layers 150, 140, and 130, and the field insulating film of the element isolation portion 101 are also etched. In order for the through-hole 381 to reach the connecting electrode 355, after the etching of the semiconductor layer 100, the insulating film 380 is also etched.

A recessed portion 383 is formed in the insulator film 160. The recessed portion 383 can be formed by etching the insulator film 160. Either of the recessed portion 383 and the through-hole 381 may be formed first. An insulating film 382 is formed on the inner surface of the through-hole 381 and the recessed portion 383.

Figure 8C:
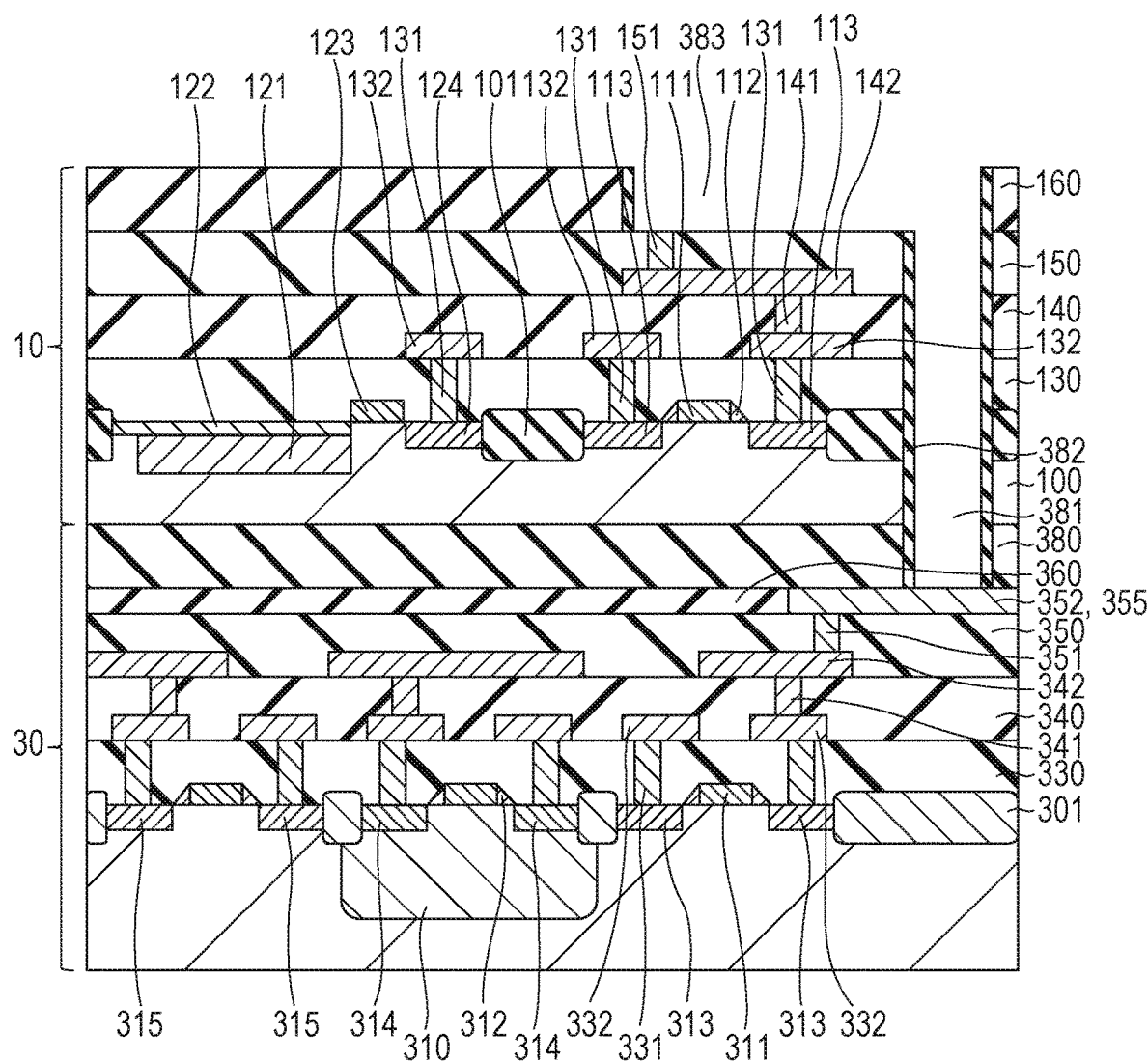

FIG. 8C shows a state in which a part of the insulating film 382 that is located on the bottom of the through-hole 381 (on the connecting electrode 355) and a part of the insulating film 382 that is located on the via plug 151 are removed by anisotropic etching. A part of the insulating film 382 that is located on the insulator film 160 is also removed. These steps are performed to achieve the insulation between a conductive member to be embedded in the through-hole 381 and the semiconductor layer 100, and the conduction with the via plug 151 and the connecting electrode 355.

Figure 9A:
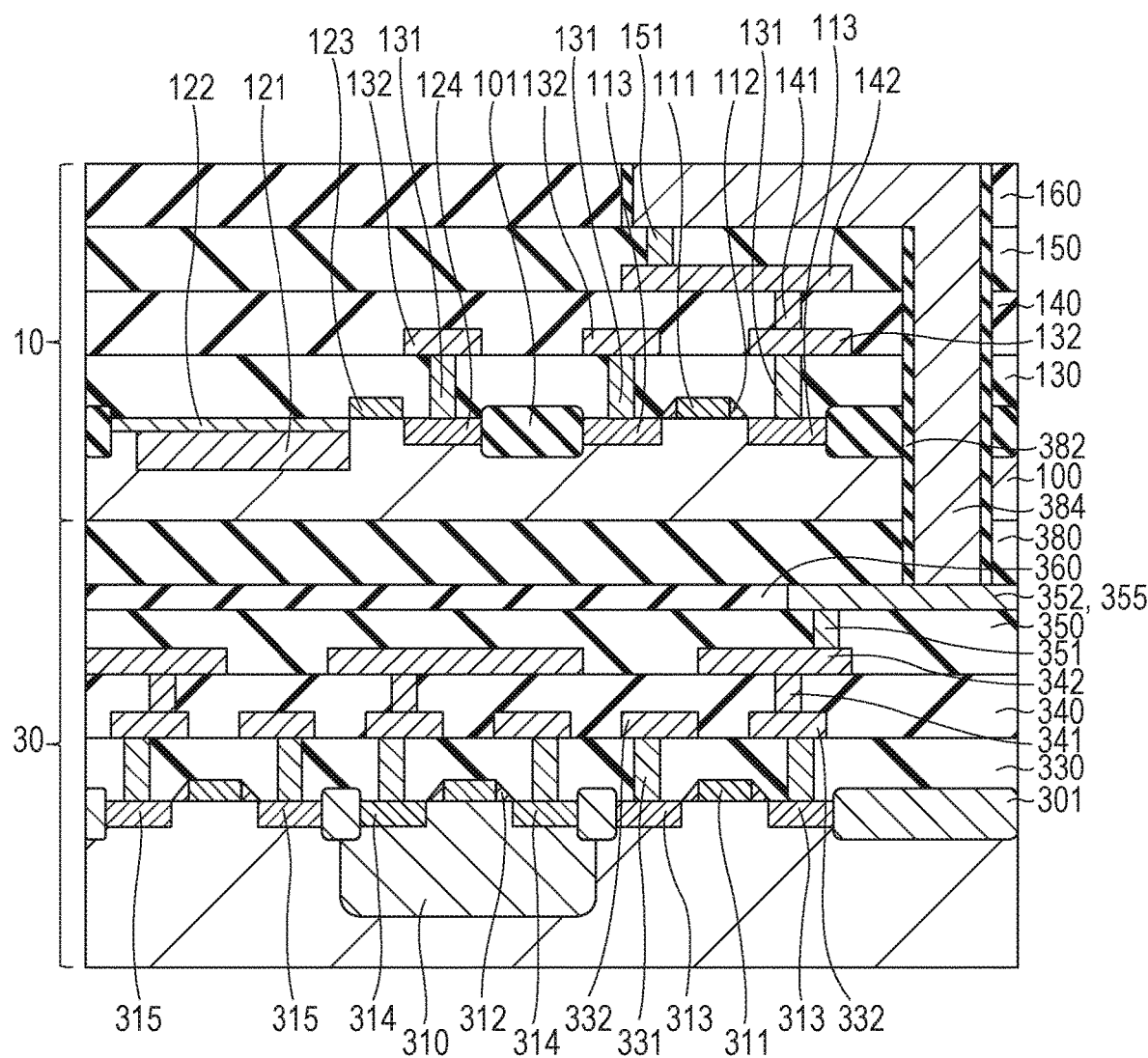
FIGS. 9A and 9B are schematic views illustrating Exemplary embodiment 2 of the method for manufacturing a photoelectric conversion device.

FIG. 9A shows the step of embedding a conductive member 383 in the through-hole 381. The conductive member 383 can be formed by forming conductive material by the formation of a copper seed layer and a copper plating layer, and then removing excess conductive material outside the through-hole 181 by CMP.

Figure 9B:
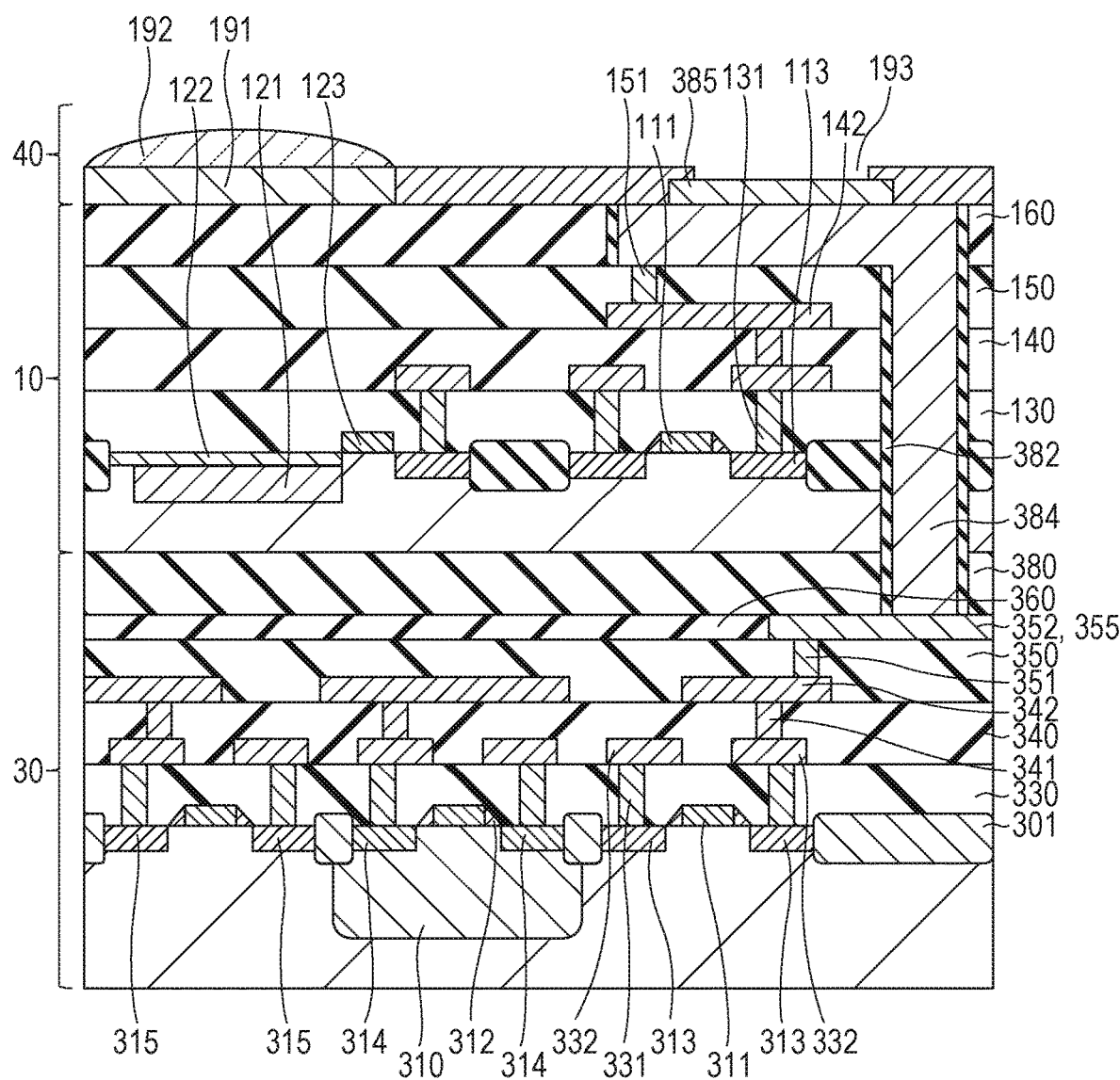

FIG. 9B shows the step of forming a pad electrode 385, a color filter 191, a microlens 192, and a pad opening 193.

In Exemplary embodiment 2, since the formation of the through-hole 381 can be performed on the front surface side of the light receiving substrate 10, the superposition accuracy can be made higher than in Exemplary embodiment 1.

Exemplary Embodiment 3

The step shown in FIGS. 10A to 10G corresponds to step A described with reference to FIG. 1A.

Figure 10A:
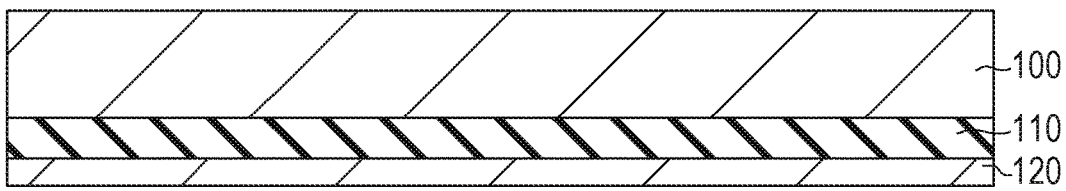
FIGS. 10A to 10G are schematic views illustrating Exemplary embodiment 3 of the method for manufacturing a photoelectric conversion device.

FIG. 10A shows that an SOI wafer is used as a semiconductor wafer having a semiconductor layer 100. The SOI wafer includes a base body 120 that supports the semiconductor layer 100, and an insulator layer 110 that is disposed between the semiconductor layer 100 and the base body 120.

Figure 10B:
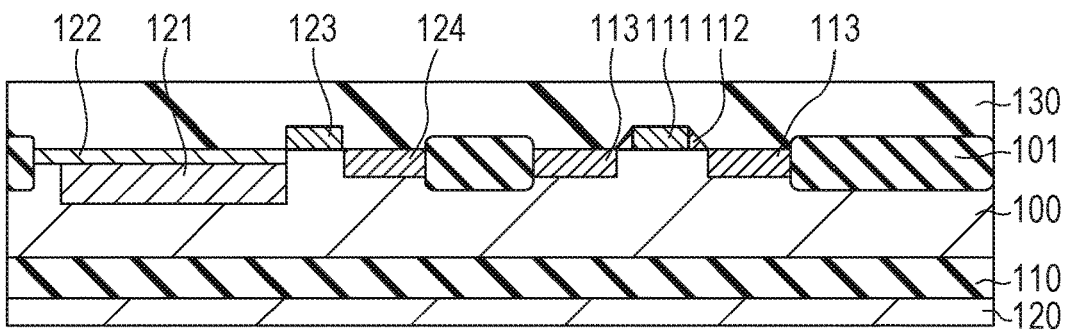

As shown in FIG. 10B, an interlayer insulating layer 130 is formed on the semiconductor layer 100 on which various semiconductor elements are formed.

Figure 10C:
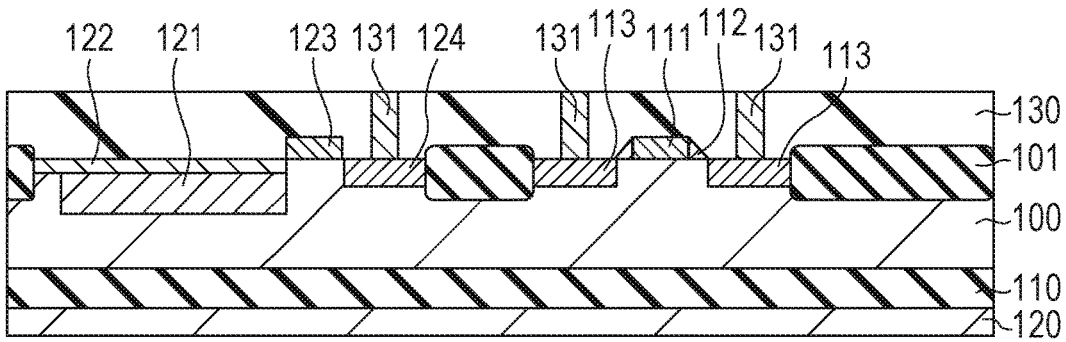

As shown in FIG. 10C, contact plugs 131 that penetrate through the interlayer insulating layer 130 and are connected to the semiconductor elements are formed.

Figure 10D:
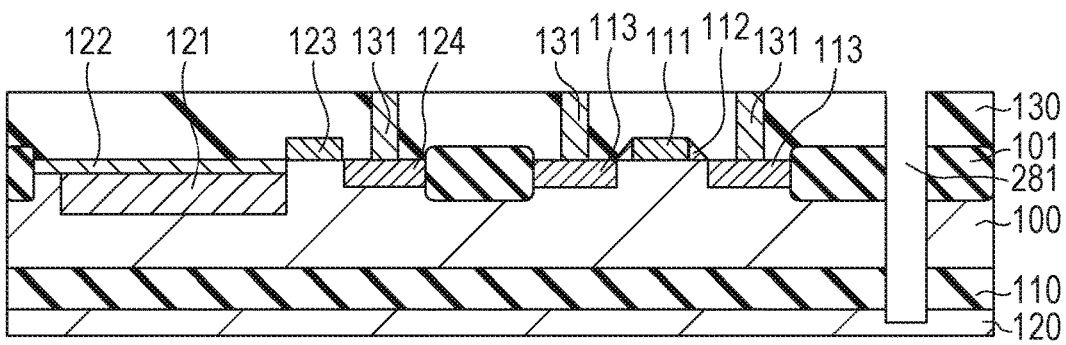

FIG. 10D shows the step of forming a hole 281 in the semiconductor layer 100. A resist is applied to the insulator film 160, and the resist is exposed and developed to form a mask. By dry-etching the semiconductor layer 100 using the mask, a through-hole 281 is formed in the semiconductor layer 100. Although, in this exemplary embodiment, the hole 281 penetrates through the semiconductor layer 100 and the insulator layer 110 and reaches the base body 120, the hole 281 may extend halfway through the insulator layer 110, or may extend halfway through the semiconductor layer 100. In order for the hole 281 to reach the semiconductor layer 100, before the etching of the semiconductor layer 100, the interlayer insulating layer 130 and the field insulating film of the element isolation portion 101 are also etched. FIG. 10C shows a state in which, after the formation of the hole 281, the resist mask is removed. Either of the hole 281 and the contact plugs 131 may be formed first, and the hole 281 and the contact plugs 131 may be formed at the same time by utilizing the difference in etching rate.

Figure 10E:
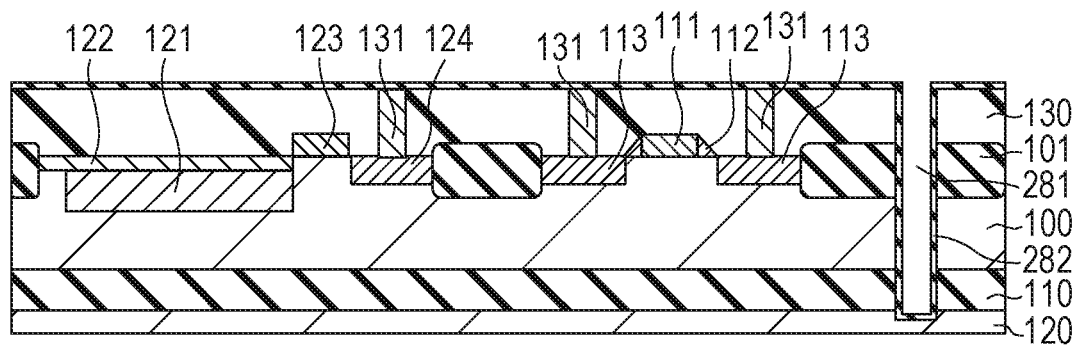

FIG. 10E shows a state in which an insulating film 282 is formed in the hole 281.

Figure 10F:
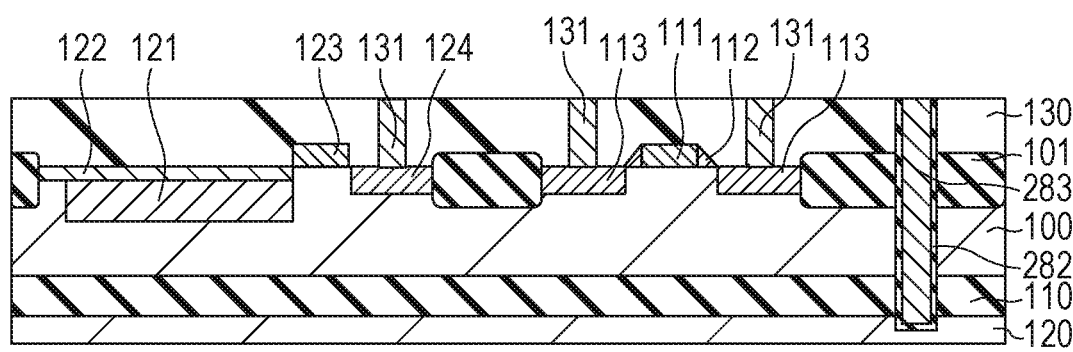

FIG. 10F shows a state in which a conductive member 283 containing tungsten (W) is embedded in the hole 281.

Figure 10G:
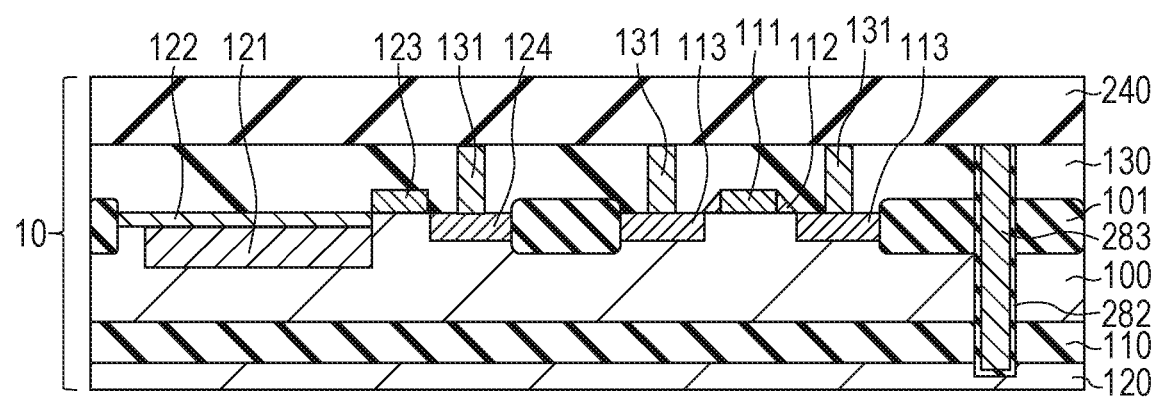

FIG. 10G shows the step of forming a protective film 240 on the interlayer insulating layer 130 such that the protective film 240 covers the conductive member 283 and the contact plugs 131.

Figure 11A:
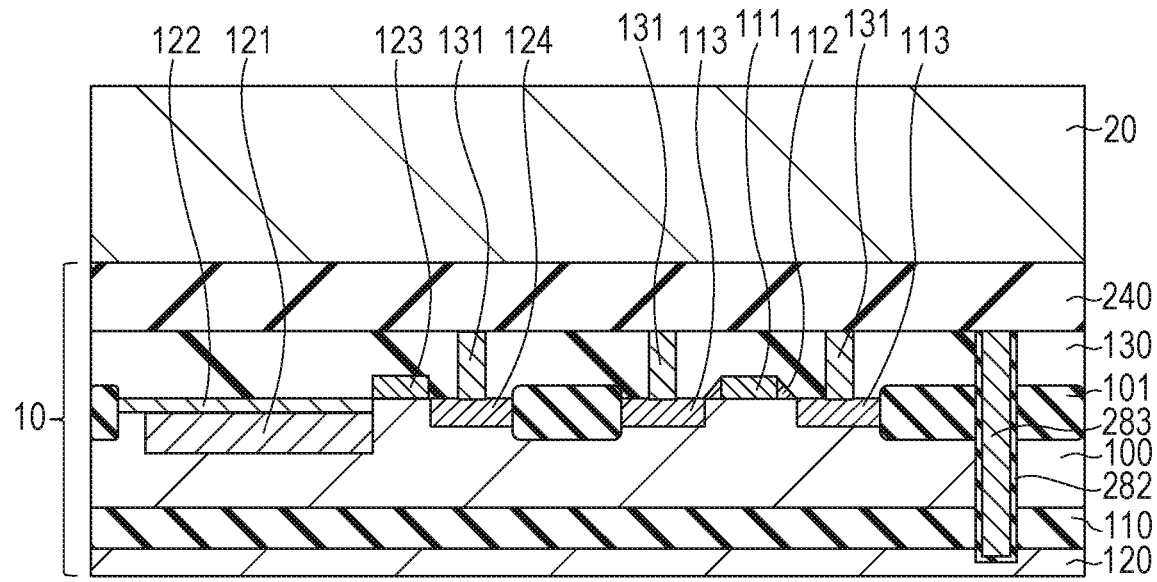
FIGS. 11A to 11D are schematic views illustrating Exemplary embodiment 3 of the method for manufacturing a photoelectric conversion device.

The step shown in FIG. 11A corresponds to step B described with reference to FIG. 1B. The supporting substrate 20 is bonded to the light receiving substrate 10, and the light receiving substrate 10 and the supporting substrate 20 are fixed to each other.

Figure 11B:
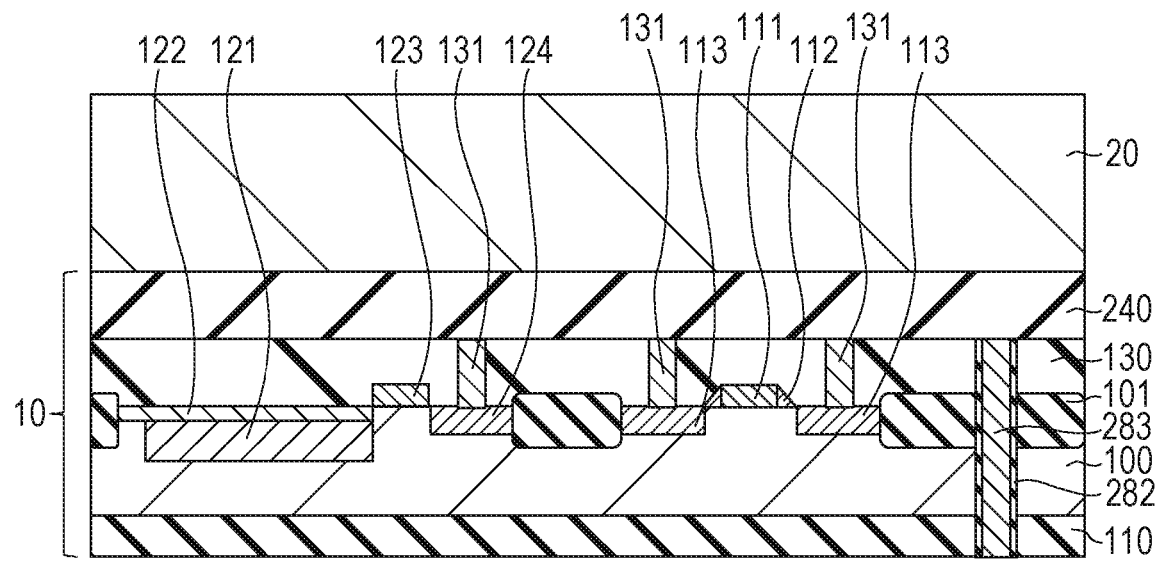

The step shown in FIG. 11B corresponds to step C described with reference to FIG. 1C. The light receiving substrate 10 is thinned by mechanical polishing (MP), chemical mechanical polishing (CMP), or wet etching. In this exemplary embodiment, the conductive member 283 in the hole 281 is exposed on the opposite side of the light receiving substrate 10 from the supporting substrate 20. A part of the light receiving substrate 10 that is removed by thinning is set according to the depth of the hole 281. If the hole 281 penetrates through the insulator layer 110, the conductive member 283 can be exposed by removing the base body 120. If the hole 281 is within the insulator layer 110, the conductive member 283 can be exposed by removing the base body 120 and at least part of the insulator layer 110. If the hole 281 does not penetrate through the semiconductor layer 100, the insulator layer 110 needs to be removed, and part of the semiconductor layer 100 needs to be removed. If the insulator layer 110 is left, damage to the semiconductor layer 100 can be reduced.

Figure 11C:
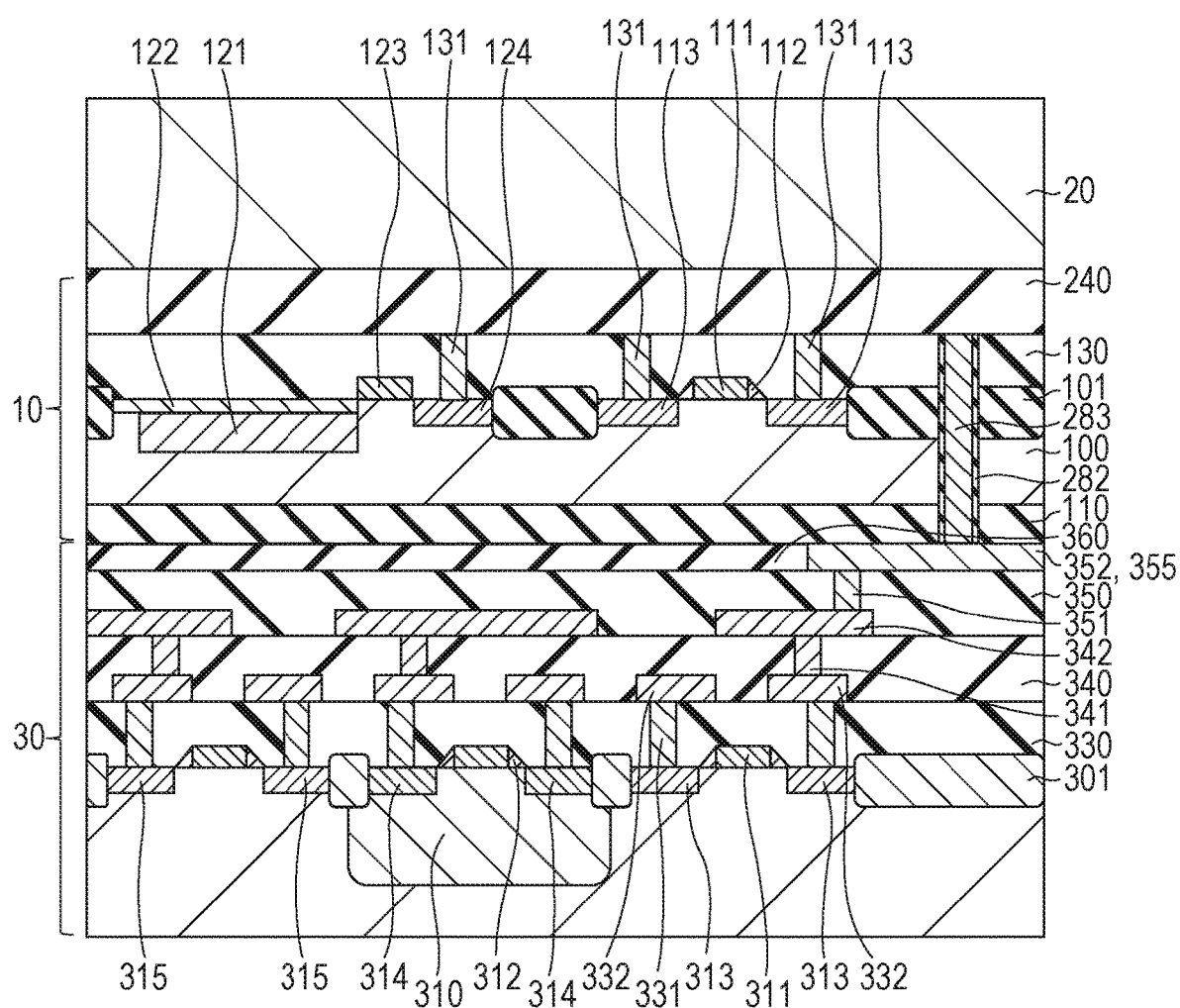

FIG. 11C shows the step of bonding the light receiving substrate 10 and the circuit substrate 30. Various transistors, resistors, capacitors, and wirings are formed on the circuit substrate 30, and a connecting electrode 355 included in the uppermost wiring layer 352 is exposed. By bonding the light receiving substrate 10 and the circuit substrate 30, the conductive member 283 of the light receiving substrate 10 and the electrode 355 of the circuit substrate 30 are electrically connected.

Figure 11D:
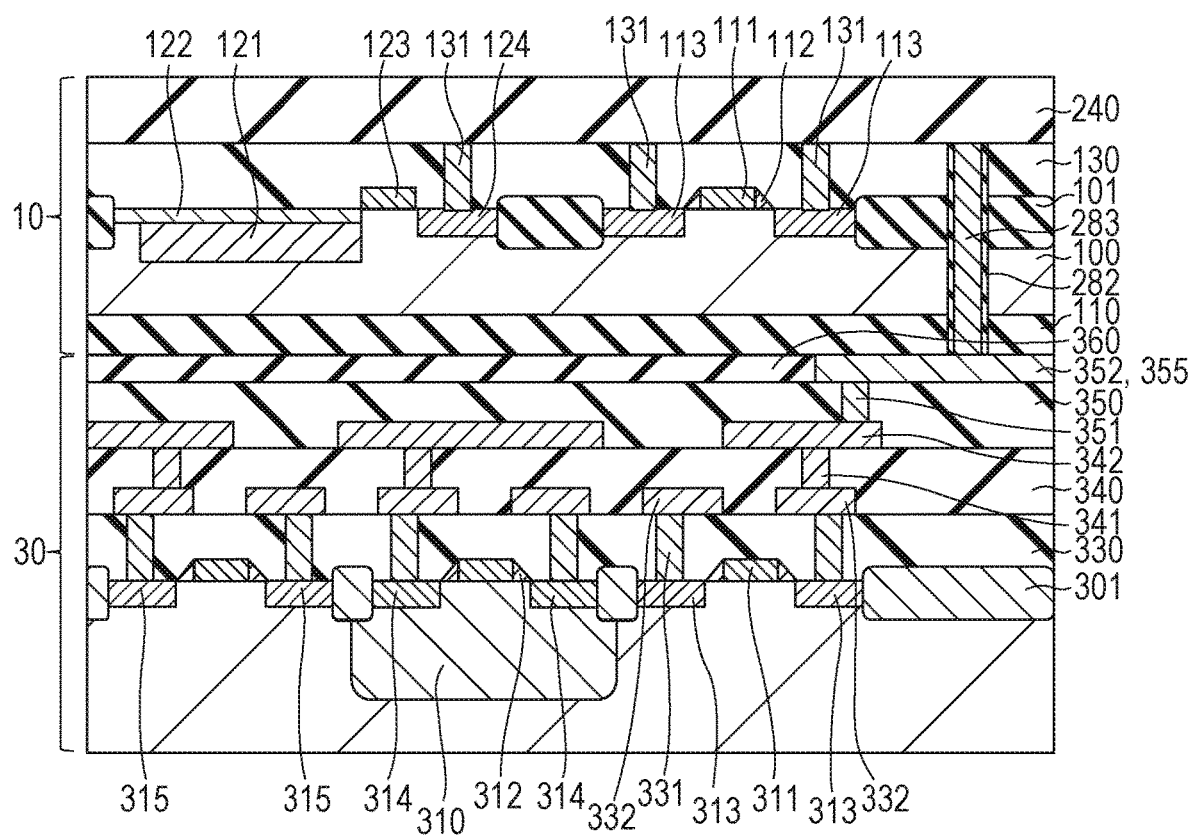

The step shown in FIG. 11D corresponds to step E described with reference to FIG. 1E. The supporting substrate 20 is removed from the light receiving substrate 10. The supporting substrate 20 may be removed by any one of stripping, BG, CMP, and wet etching.

Figure 12A:
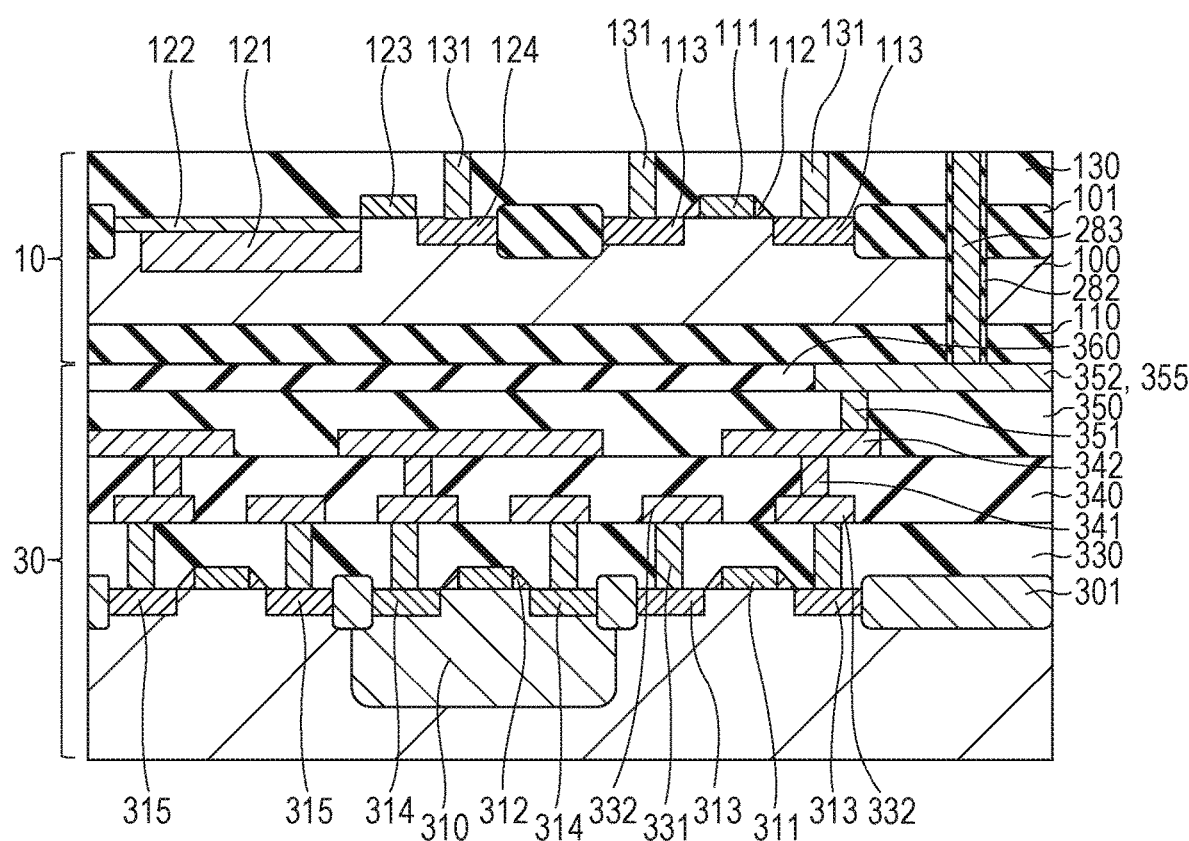
FIGS. 12A to 12C are schematic views illustrating Exemplary embodiment 3 of the method for manufacturing a photoelectric conversion device.

In the step shown in FIG. 12A, the protective film 240 is removed.

Figure 12B:
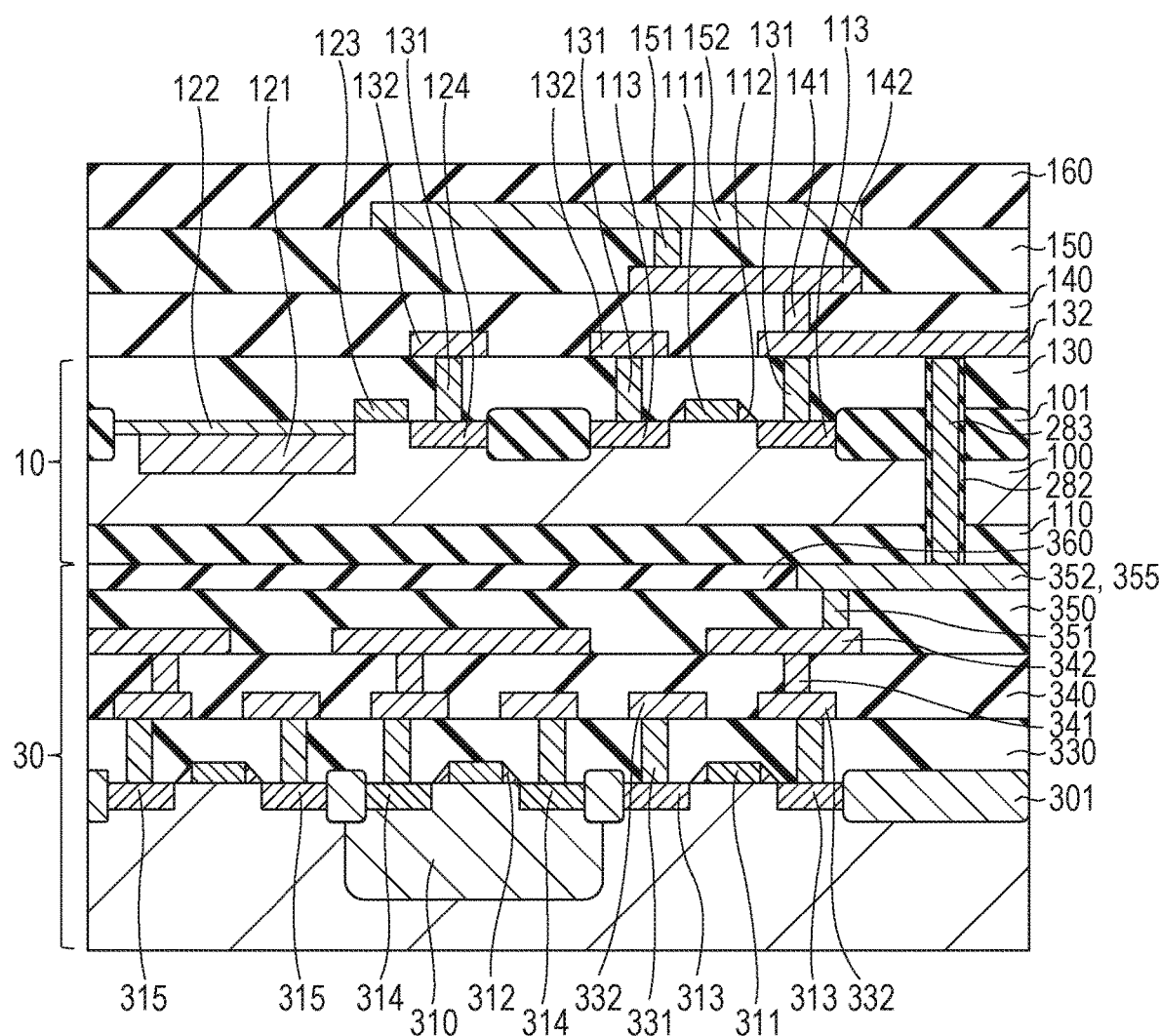

In the step shown in FIG. 12B, a first wiring layer 132, an interlayer insulating layer 140, a via plug 141, a second wiring layer 142, an interlayer insulating layer 150, a via plug 151, and an insulator film 160 are formed on the interlayer insulating layer 130. The protective film 240 may not be removed in the step shown in FIG. 12A, and the protective film 240 may be utilized as an interlayer insulating layer.

Figure 12C:
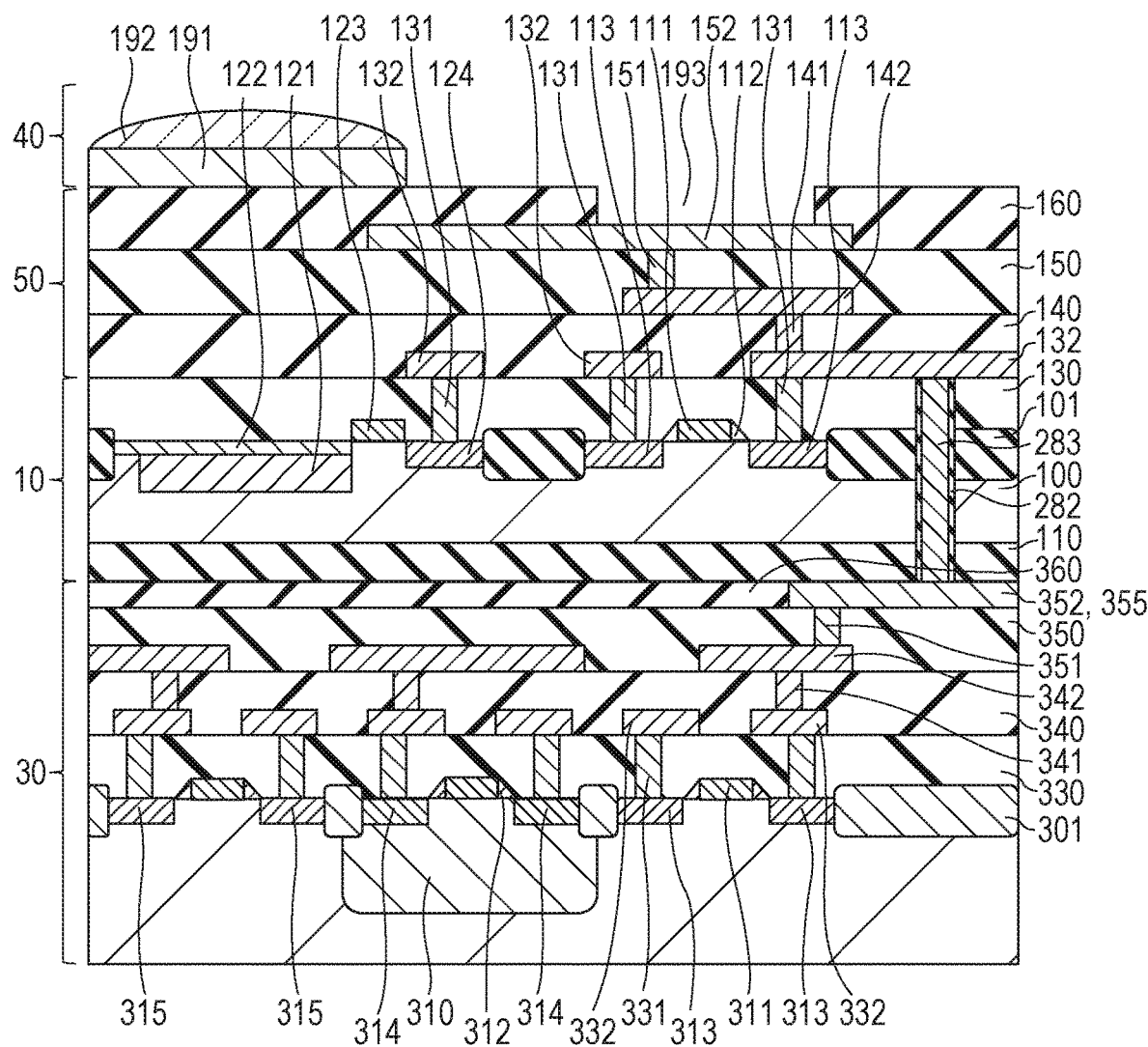

The step shown in FIG. 12C corresponds to step F described with reference to FIG. 1F. A color filter 191 and a microlens 192 are formed on the light receiving substrate 10.

In Exemplary embodiment 3, before forming the wiring layer, the bonding of the supporting substrate 20, the thinning of the light receiving substrate 10, and the removal of the supporting substrate 20 are performed. Therefore, not only damage to the color filter 191 and the microlens 192 but also damage to the wiring layer can be suppressed. When copper wiring is used, separation at the interface between the wiring layer and the insulating layer or the interface between the wiring layer and the diffusion prevention layer can be suppressed.

Exemplary Embodiment 4

Figure 13A:
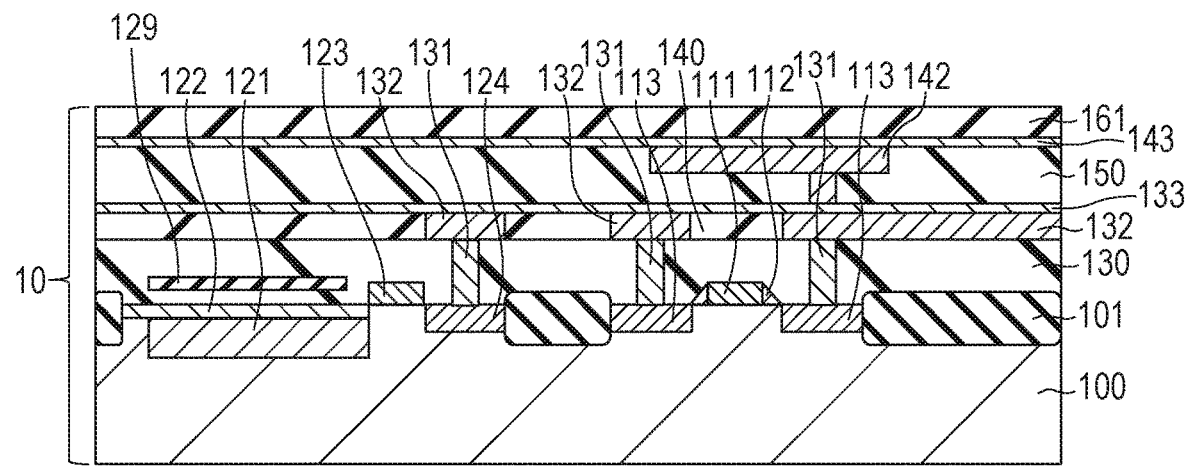
FIGS. 13A to 13E are schematic views illustrating Exemplary embodiment 4 of the method for manufacturing a photoelectric conversion device.

The step shown in FIG. 13A corresponds to step A described with reference to FIG. 1A. Wiring layers 132 and 142 are copper wirings having a damascene structure. The first wiring layer 132 has a single damascene structure, and the second wiring layer 142 has a dual damascene structure. A diffusion prevention layer 133 is disposed between the first wiring layer 132 and the interlayer insulating layer 150, and a diffusion prevention layer 143 is disposed between the second wiring layer 142 and the interlayer insulating layer 150. An insulating layer 161 is disposed on the diffusion prevention layer 143.

Figure 13B:
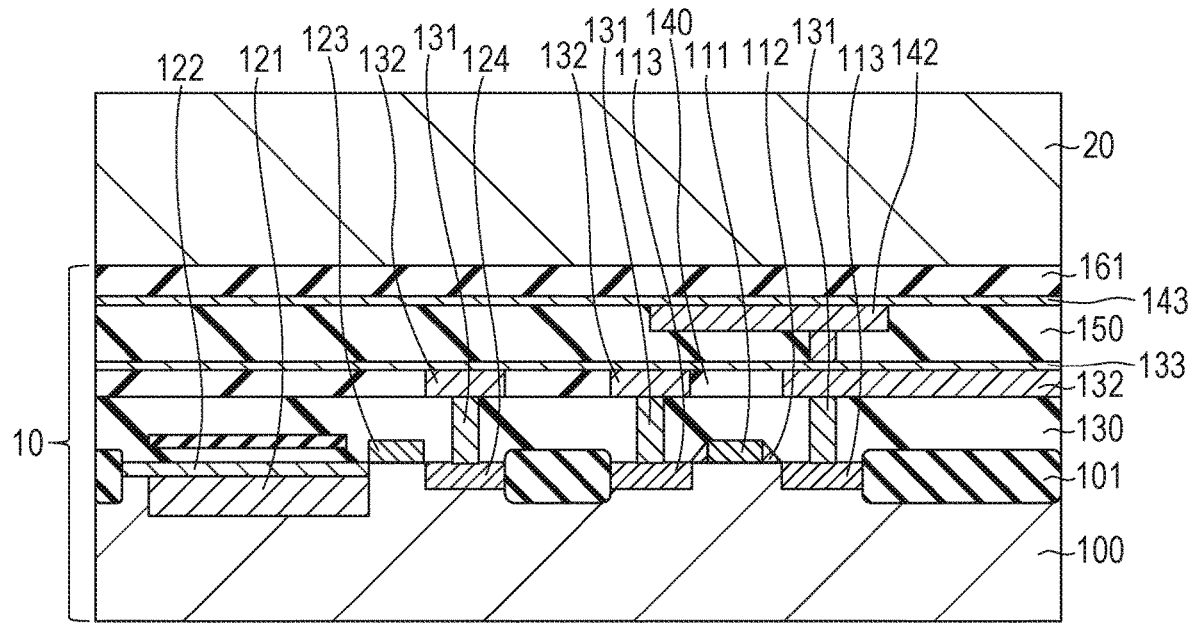

The step shown in FIG. 13B corresponds to step B described with reference to FIG. 1B. The supporting substrate 20 is bonded to the insulating layer 161 of the light receiving substrate 10.

Figure 13C:
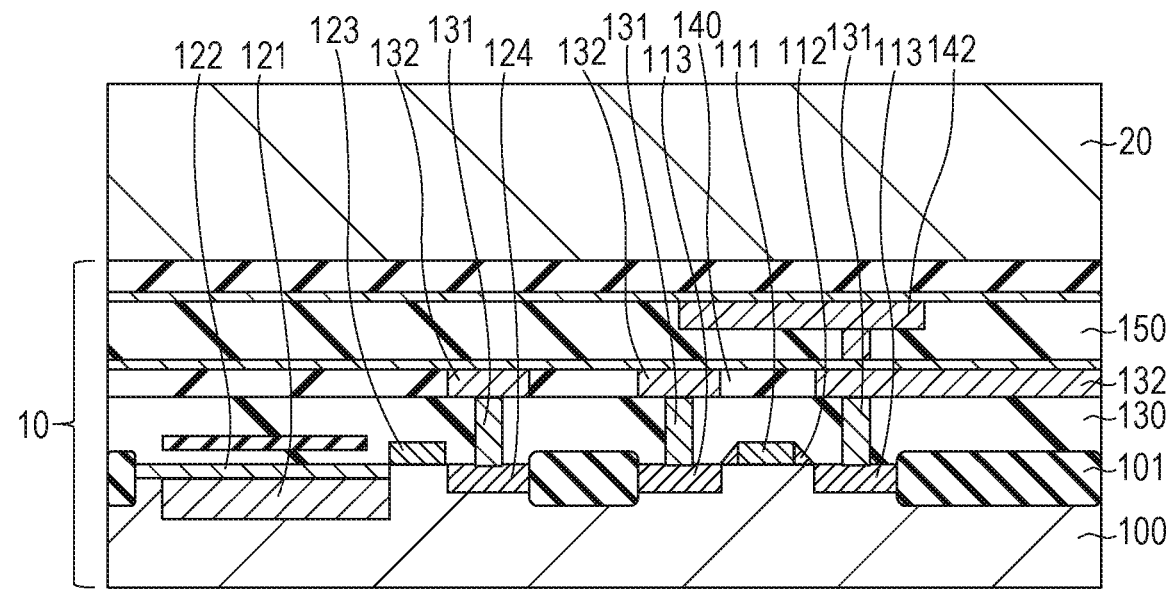

The step shown in FIG. 13C corresponds to step C described with reference to FIG. 1C. The semiconductor layer 100 of the light receiving substrate 10 is thinned.

Figure 13D:
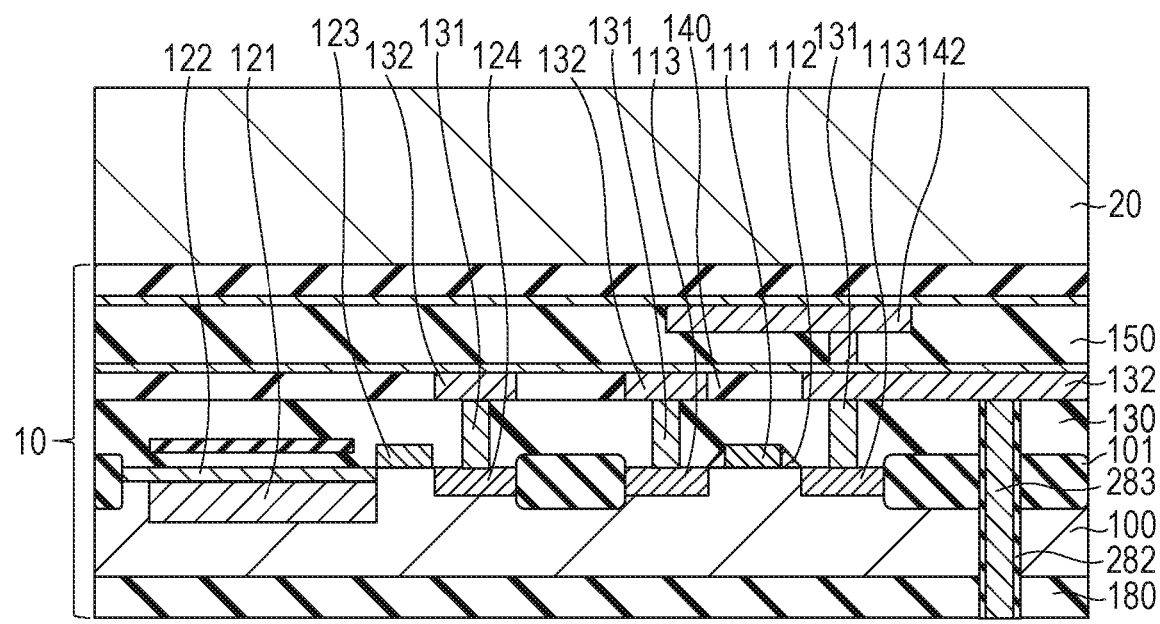

The step shown in FIG. 13D corresponds to the step of forming a through electrode in Exemplary embodiment 1. A conductive member 283 penetrating through the semiconductor layer 100 is formed.

Figure 13E:
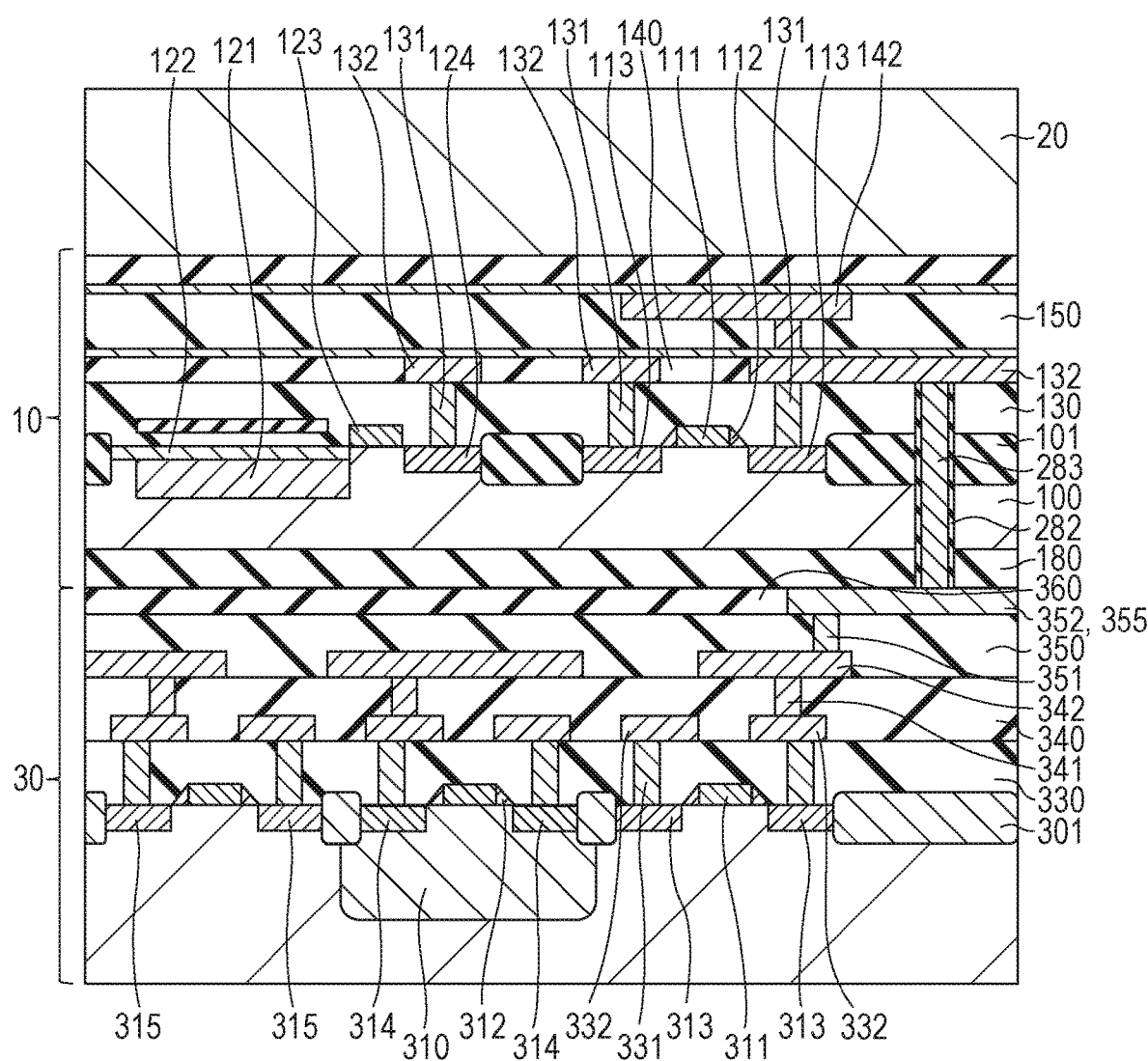

The step shown in FIG. 13E corresponds to step D described with reference to FIG. 1D. The circuit substrate 30 is bonded to the light receiving substrate 10.

Figure 14A:
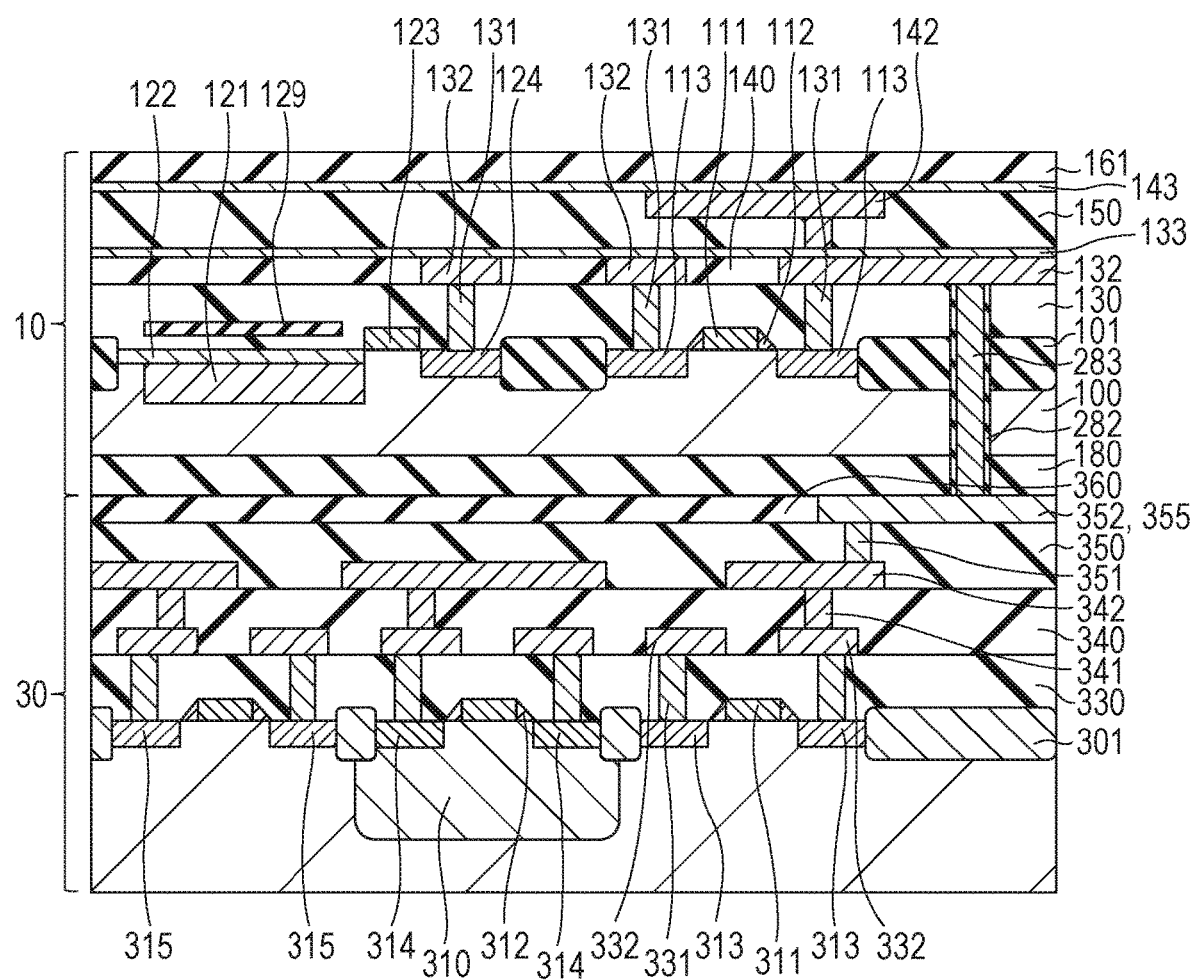
FIGS. 14A to 14C are schematic views illustrating Exemplary embodiment 4 of the method for manufacturing a photoelectric conversion device.

The step shown in FIG. 14A corresponds to step E described with reference to FIG. 1E. The supporting substrate 20 is removed from the light receiving substrate 10.

The step shown in FIGS. 14B and 14C corresponds to step F described with reference to FIG. 1F.

Figure 14B:
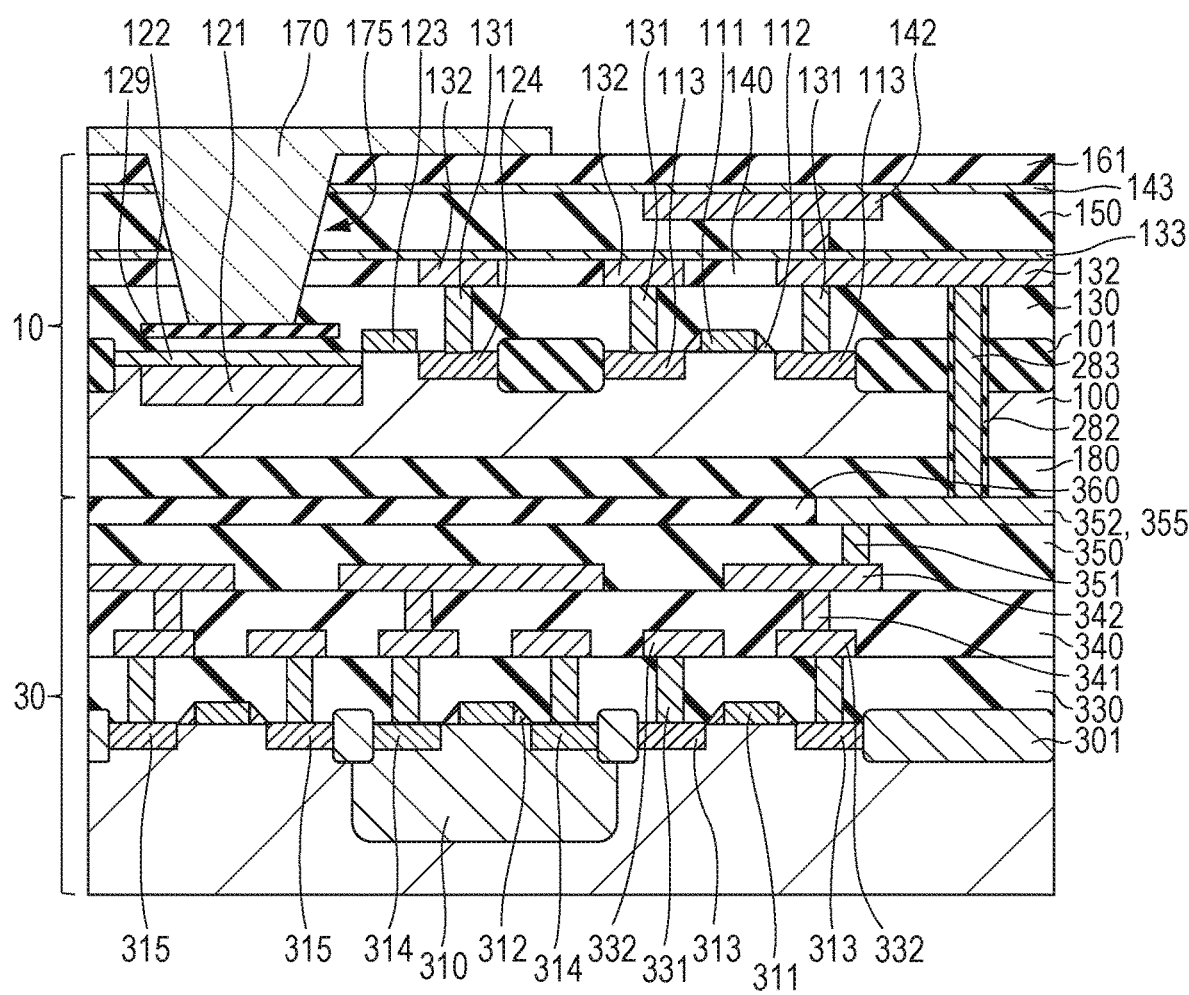

In the step shown in FIG. 14B, a light guiding portion 170 is formed. First, using a mask having an opening over the photoelectric conversion element PD, the interlayer insulating layers 161, 150, 140, and 130 and the diffusion prevention layers 143 and 133 are etched. An opening 175 is thereby formed. When forming the opening 175, an insulating layer 129 that is disposed under the interlayer insulating layer 130 in the step shown in FIG. 13A functions as an etch stop layer. By embedding a light-transmitting material such as silicon nitride or resin in the opening 175, the light guiding unit 170 is formed. The light-transmitting material located outside the opening 175 is removed as needed.

Figure 14C:
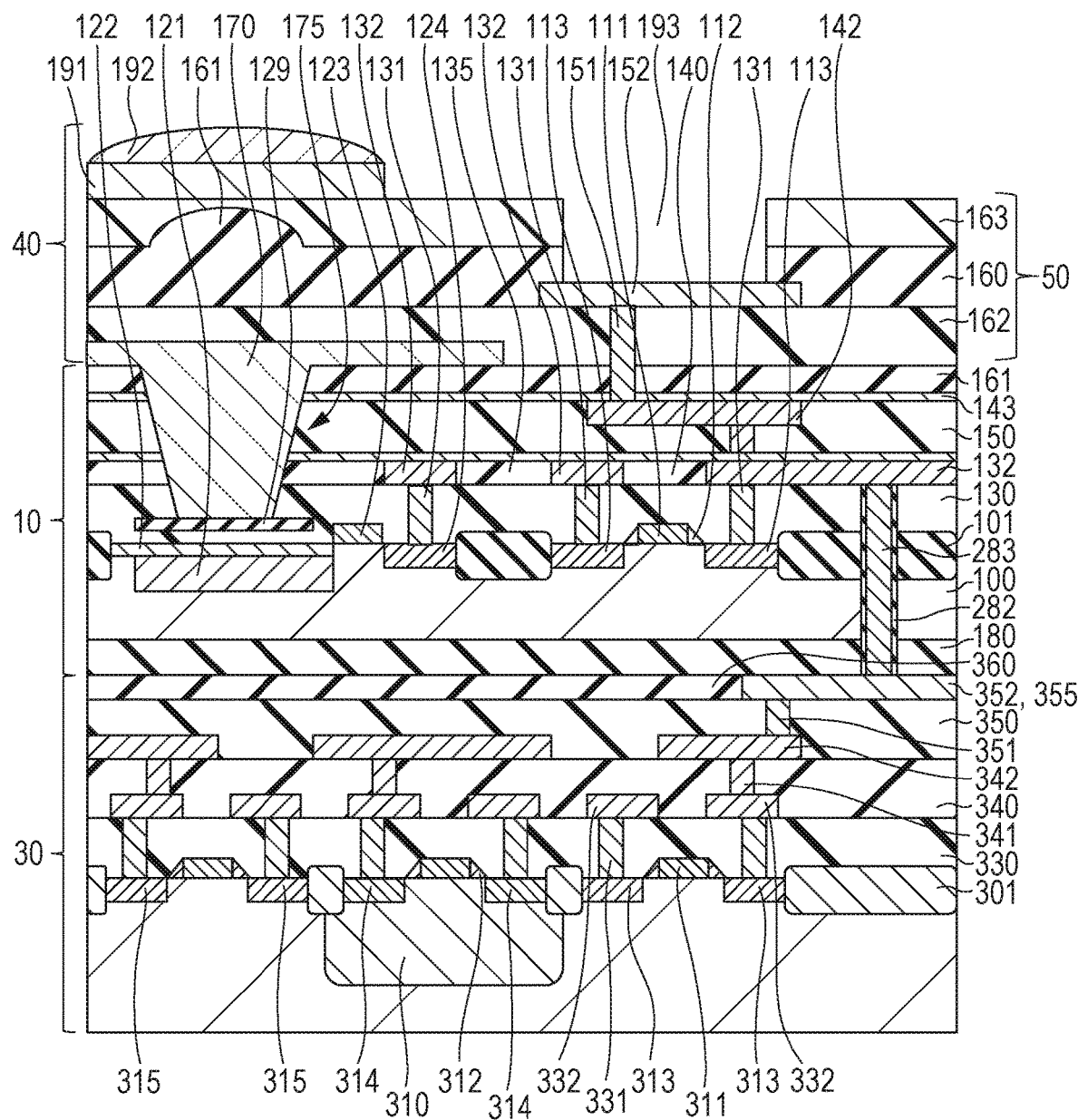

In the step shown in FIG. 14C, an interlayer insulating layer 162 is formed so as to cover the light guiding unit 170. A via plug 151 is formed in the interlayer insulating layers 162 and 161, and a pad electrode 152 is formed on the via plug 151. An insulator film 160 serving as a passivation film is formed so as to cover the pad electrode 152. The insulator film 160 can be processed so as to have a light condensing portion 161 using, for example, an etch-back method. The light condensing portion 161 functions as an interlayer lens. The insulator film 160 suitable for forming the light condensing portion 161 can be a silicon nitride film. A planarizing film 163 made of resin is formed on the insulator film 160. A color filter 191 and a microlens 192 are formed on the planarizing film 163. The light guiding portion 170, the light condensing portion 161, the planarizing film 163, the color filter 191, and the microlens 192 correspond to the optical member 40 described with reference to FIG. 1F. The via plug 151, the pad electrode 152, the interlayer insulating layer 162 are wiring members 50 formed after the removal of the supporting substrate 20.

In this exemplary embodiment, since the light guiding portion 170 is provided, if a plurality of wiring layers are on the light receiving surface of the semiconductor layer 100, stray light or the like can be suppressed, and light use efficiency can be improved.

Since the light guiding portion 170 is formed after the removal of the supporting substrate 20, the effect of damage during thinning and damage that can occur during the removal of the supporting substrate 20 on the light guiding unit 170 can be reduced.

Although, in this exemplary embodiment, wiring layers are formed before thinning as in Exemplary embodiment 1, wiring layers and interlayer insulating layers can be formed after the removal of the supporting substrate 20 as in Exemplary embodiment 2. The formation of the through electrode may be similar to that in Exemplary embodiment 2, or may be similar to that in Exemplary embodiment 3.

In relation to the above-described embodiments, even if not specifically described in this specification, matters that can be derived from the accompanying drawings and the common general knowledge also form part of the present disclosure. Various changes may be made in the present invention without departing from the scope of technical idea of the present disclosure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-094171 filed May 9, 2016, which is hereby incorporated by reference herein in its entirety.

What is claimed is:

1. A method for manufacturing a photoelectric conversion device comprising:
    fixing a first substrate which includes a first semiconductor layer including a photoelectric conversion element, to a second substrate;
    thinning the first semiconductor layer after fixing the first substrate to the second substrate;
    forming a through hole in the first semiconductor layer after the thinning of the first semiconductor layer;
    forming a conductive member in the through hole; and
    fixing the first substrate to a third substrate which includes a second semiconductor layer provided with a first transistor such that the first substrate is located between the third substrate and the second substrate after the forming of the conductive member;
    wherein, in the step of fixing the first substrate to the second substrate, the first substrate is provided with a second transistor;
    wherein the conductive member electrically between the first transistor and the second transistor.

2. The method for manufacturing a photoelectric conversion device according to claim 1, wherein, in the step of fixing the first substrate to the second substrate, the first substrate is provided with a wiring member.

3. The method for manufacturing a photoelectric conversion device according to claim 2,
    wherein, in the step of fixing the first substrate to the second substrate, a light incident surface of the first substrate is fixed to the second substrate, and
    wherein in the step of thinning the first semiconductor layer, the first semiconductor layer is thinned from an opposite side surface to the light incident surface of the first substrate.

4. The method for manufacturing a photoelectric conversion device according to claim 3, wherein the through hole is formed by dry-etching.

5. The method for manufacturing a photoelectric conversion device according to claim 1, wherein, in the step of fixing the first substrate to the second substrate, the first substrate includes a base body located on the opposite side of the first semiconductor layer from the second substrate, and an insulator layer disposed between the first semiconductor layer and the base body, and wherein, in the step of thinning, the base body, the insulator layer and at least part of the first semiconductor layer are removed.

6. The method for manufacturing a photoelectric conversion device according to claim 1, wherein, after the step of thinning, the thickness of the first semiconductor layer of the first substrate is less than 100 μm.

7. The method for manufacturing a photoelectric conversion device according to claim 1, further comprising the step of removing the second substrate after the step of fixing the first substrate to the third substrate.

8. The method for manufacturing a photoelectric conversion device according to claim 7, further comprising the step of, after the step of removing the second substrate, forming at least one of a light condensing portion and a wavelength selecting portion on the opposite side of the first substrate from the third substrate.

9. The method for manufacturing a photoelectric conversion device according to claim 7, further comprising the step of, after the step of removing the second substrate, forming a wiring member on the opposite side of the first substrate from the third substrate.

10. The method for manufacturing a photoelectric conversion device according to claim 7, wherein, in the step of fixing the first substrate to the second substrate, the first substrate includes a contact plug, and further comprising the step of, after the step of removing the second substrate, forming a plurality of wiring layers on the opposite side of the first substrate from the third substrate.

11. The method for manufacturing a photoelectric conversion device according to claim 7, further comprising the step of, after the step of removing the second substrate, forming a light guiding portion on the opposite side of the first substrate from the third substrate.

12. The method for manufacturing a photoelectric conversion device according to claim 1, wherein, after the step of thinning, the thickness of the first semiconductor layer is more than 5 μm.

13. The method for manufacturing a photoelectric conversion device according to claim 1, wherein the conductive member is a through-silicon via (TSV).

14. The method for manufacturing a photoelectric conversion device according to claim 1, wherein the second substrate is a glass wafer or a silicon wafer.

15. The method for manufacturing a photoelectric conversion device according to claim 1, further comprising dicing the first substrate and the third substrate.

16. The method for manufacturing a photoelectric conversion device according to claim 1, wherein a silicide layer containing cobalt silicide or nickel silicide is formed on the first transistor.

17. The method for manufacturing a photoelectric conversion device according to claim 1, wherein the first transistor forms a digital signal processing circuit.

* * * * *